(12) United States Patent
McVeigh

(10) Patent No.: US 11,949,427 B2
(45) Date of Patent: Apr. 2, 2024

(54) FORCE SENSING SYSTEMS

(71) Applicant: Cirrus Logic International Semiconductor Ltd., Edinburgh (GB)

(72) Inventor: Gavin McVeigh, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 779 days.

(21) Appl. No.: 17/089,457

(22) Filed: Nov. 4, 2020

(65) Prior Publication Data

US 2021/0181044 A1    Jun. 17, 2021

Related U.S. Application Data

(60) Provisional application No. 62/949,011, filed on Dec. 17, 2019, provisional application No. 62/948,984, filed on Dec. 17, 2019.

(51) Int. Cl.
*H03M 1/78*        (2006.01)
*G01L 1/22*        (2006.01)
(Continued)

(52) U.S. Cl.
CPC ........... *H03M 1/785* (2013.01); *G01L 1/2268* (2013.01); *H03M 1/0607* (2013.01); *H03M 1/16* (2013.01);
(Continued)

(58) Field of Classification Search
CPC ............................ H03M 1/785; G01L 1/2268
See application file for complete search history.

(56) References Cited

U.S. PATENT DOCUMENTS 4,169,243 A * 9/1979 Payne .................... G01K 1/024
374/E1.004
4,401,974 A   8/1983 Jarrett et al.
(Continued)

FOREIGN PATENT DOCUMENTS

| DE | 10231447 A1 | 1/2004 |
|----|-------------|--------|
| EP | 0482487 A2  | 10/1991 |
| EP | 1542367 A2  | 6/2005 |

OTHER PUBLICATIONS

Combined Search and Examination Report under Sections 17 and 18(3), UKIPO, Application No. GB2000268.9, dated Mar. 18, 2020.
(Continued)

*Primary Examiner* — Clayton E. LaBalle
*Assistant Examiner* — Diana Hancock
(74) *Attorney, Agent, or Firm* — Jackson Walker L.L.P.

(57) ABSTRACT

The present disclosure relates to a compensation circuit for compensating for an offset voltage that is present in an output signal output by a force sensor. The compensation circuit comprises: voltage divider circuitry, the voltage divider circuitry configured to receive a bias voltage that is also supplied to the force sensor and to output a control voltage derived from the bias voltage, wherein a component mismatch ratio of the voltage divider circuitry is adjustable to correspond to a component mismatch ratio of the force sensor; current generator circuitry configured to receive the control voltage and to generate a compensating current based on the received control voltage; and amplifier circuitry configured to receive the differential signal output by the force sensor and the compensating current and to output a compensated differential output signal in which the offset voltage is at least partially cancelled.

20 Claims, 13 Drawing Sheets

(51) Int. Cl.
*H03M 1/06* (2006.01)
*H03M 1/16* (2006.01)
*H03M 1/66* (2006.01)
*H03M 1/80* (2006.01)
*H03F 3/45* (2006.01)

(52) U.S. Cl.
CPC ........... *H03M 1/662* (2013.01); *H03M 1/802* (2013.01); *H03F 3/45* (2013.01); *H03M 1/808* (2013.01)

(56) References Cited

U.S. PATENT DOCUMENTS

| | | |
|---|---|---|
| 4,465,996 A | 8/1984 | Boyacigiller |
| 4,595,910 A | 6/1986 | Wine |
| 4,947,172 A | 8/1990 | Suzuki |
| 6,411,237 B1 | 6/2002 | Lautzenhiser |
| 6,801,149 B2 | 10/2004 | Walton et al. |
| 7,336,211 B1 | 2/2008 | Lai |
| 8,884,799 B2 | 11/2014 | Price et al. |
| 9,337,860 B1 | 5/2016 | Li et al. |
| 9,438,252 B1 | 9/2016 | He et al. |
| 11,303,294 B2 | 4/2022 | McVeigh |
| 2002/0171575 A1 | 11/2002 | Marten |
| 2015/0236648 A1* | 8/2015 | Ahmad ............... H03F 3/45977 330/84 |
| 2016/0377501 A1 | 12/2016 | Agarwal et al. |
| 2018/0323798 A1* | 11/2018 | Liu ....................... H03M 1/682 |

OTHER PUBLICATIONS

Combined Search and Examination Report under Sections 17 and 18(3), UKIPO, Application No. GB2000269.7, dated Jun. 9, 2020.

* cited by examiner

FORCE SENSING SYSTEMS

The present disclosure claims priority to U.S. Provisional Patent Application Ser. No. 62/949,011, filed Dec. 17, 2019, and U.S. Provisional Patent Application Ser. No. 62/948,984, filed Dec. 17, 2019, each of which is incorporated by reference herein in its entirety.

FIELD OF THE INVENTION

The present disclosure relates to the field of force sensing systems.

BACKGROUND

Electronic devices such as mobile phones, tablet computers and the like typically include one or more mechanical switches or buttons, i.e. user input transducers, for receiving user inputs, e.g. for adjusting a volume of audio output by the device. Such mechanical switches and buttons have a number of disadvantages, including susceptibility to damage from ingress of water, dust and other debris, limited operational life due to mechanical wear and tear, and relatively greater size and/or cost, compared to some other types of user input transducer.

Force sensors are increasingly being used as an alternative to traditional mechanical switches and buttons as user input devices to detect user inputs such as touches, button presses and the like. Force sensors are typically less susceptible to the adverse effects of aging than mechanical switches, buttons and other types of user input transducers or devices, as they typically include either no moving parts, or fewer moving parts than a mechanical switch or button. Additionally, force sensors can typically be implemented in such a manner that no gaps, i.e. discontinuities, exist through which water, dust or other debris can enter the sensor or a device incorporating the sensor, making them particularly suitable in applications where resistance to ingress of water, dust and other debris are important. For example, resistive force sensors can be implemented by printing patterns of resistive ink onto a suitable substrate or carrier. Further, a force sensor typically occupies less physical space than a mechanical switch, button or the like of equivalent functionality, and so the use of force sensors can either increase the amount of space available for other components of a device or reduce the overall size of the device, both of which can be a major advantage in the design and development of modern small form-factor devices such as mobile telephones, for which the integration of multiple different functionalities in a restricted amount of space is an ever-present challenge.

Additionally, the use of force sensors can enable enhanced feature content by allowing the shape and force of a button press to be identified and mapped to a particular function and can permit, for example, the entire edge of a phone to be realised as a continuous strip of "buttons", increasing user experience and complexity.

Thus, force sensors represent a viable and commercially attractive alternative to traditional mechanical switches and buttons. However, the use of force sensors as input devices presents other challenges. Embodiments of the present disclosure aim to address, at least partially, some of these challenges.

According to a first aspect the invention provides a compensation circuit for compensating for an offset voltage that is present in an output signal output by a force sensor, the compensation circuit comprising:

voltage divider circuitry, the voltage divider circuitry configured to receive a bias voltage that is also supplied to the force sensor and to output a control voltage derived from the bias voltage, wherein a component mismatch ratio of the voltage divider circuitry is adjustable to correspond to a component mismatch ratio of the force sensor;

current generator circuitry configured to receive the control voltage and to generate a compensating current based on the received control voltage; and amplifier circuitry configured to receive the differential signal output by the force sensor and the compensating current and to output a compensated differential output signal in which the offset voltage is at least partially cancelled.

The force sensor may be a resistive force sensor, the voltage divider circuitry may comprises a plurality of resistance, and the voltage divider circuitry may be configured such that a ratio of the plurality of resistances is adjustable so as to correspond to a ratio of resistances of the resistive force sensor.

The voltage divider circuitry may be configured to output a differential output voltage.

The voltage divider circuitry may comprise first, second and third variable resistances that are adjustable such that a ratio of the first, second and third resistances is adjustable so as to correspond to a ratio of resistances of the resistive force sensor.

The resistances of the voltage divider circuitry may be adjustable such that a calibration ratio comprising:
  a difference between a ratio of the combined values of the second and third resistances to the combined values of the first, second and third resistances and a ratio of the value of the third resistance to the combined values of the first, second and third resistances is equal to:
  a sensor ratio comprising:
  a difference between a ratio of the value of the first resistance of the force sensor to the value of the second resistance of the force sensor and a ratio of the value of the third resistance of the force sensor to the value of the fourth resistance of the force sensor.

The first, second and third variable resistances may comprise respective first, second and third arrays of selectable resistances.

The selectable resistances of each array may be coupled in parallel with each other.

Alternatively, the selectable resistances of each array may be arranged in a ladder configuration.

Resistance values of the selectable resistances of each array may be weighted with respect to each other.

The voltage divider circuitry and the amplifier circuitry may constitute a digital to analogue converter (DAC).

The resistance values of the selectable resistances of each array may be weighted such that an input-output characteristic of the DAC is non-monotonic.

The resistance values of the selectable resistances of each array may be weighted such that for a given bias voltage, a particular DAC output value can be produced by a plurality of different combinations of selectable resistances of the first, second and third arrays.

The resistance values of the selectable resistances of each array may be weighted so as to produce a plurality of overlapping DAC output signal ranges.

The amplifier circuitry may comprise a feedback loop, wherein the compensating current is injected into the feedback loop so as to generate a compensating voltage in the amplifier circuitry to at least partially cancel the offset voltage in the compensated differential output signal.

The feedback loop may include first and second resistances, wherein the compensating current is injected at a node between the first and second resistances.

The compensation circuit may further comprise a gain element coupled to an output of the voltage divider circuitry so as to apply gain to the control voltage output by the voltage divider circuitry.

The compensation circuit may further comprise a resistance coupled to an output of the gain element.

A resistance value of the resistance may be equal to a resistance value of a parallel combination of the first and second resistances.

A resistance value of the resistance may be equal to a multiple of a resistance value of a parallel combination of the first and second resistances.

The compensation circuit may further comprise controller circuitry operative to adjust the resistances of the first, second and third variable resistances by selecting one or more resistances of each of the first, second and third arrays of selectable resistances.

The controller circuitry may be operative to perform a search in order to select the one or more resistances.

The controller circuitry may be operative to select each of the selectable resistances of the first, second and third arrays according to a predefined sequence and to compare an output of the voltage divider circuitry to a threshold order to select the one or more resistances.

The controller circuitry may be operative to compare the differential output of the force sensor to the compensated differential output signal and to adjust the resistances of the first, second and third variable resistances if the result of the comparison indicates the presence of offset in the compensated differential output signal.

According to a second aspect the invention provides a compensation circuit for compensating for an offset voltage that is present in a differential output signal output by a force sensor, the compensation circuit comprising:
  voltage divider circuitry, the voltage divider circuitry configured to receive a bias voltage that is also supplied to the force sensor and to output a control voltage derived from the bias voltage, wherein a ratio of the control voltage to the bias voltage is adjustable to correspond to a ratio of a quiescent differential output voltage of the force sensor to the bias voltage;
  current generator circuitry configured to receive the control voltage and to generate a compensating current based on the received control voltage; and
  amplifier circuitry configured to receive the differential signal output by the force sensor and the compensating current and to output a compensated differential output signal in which the offset voltage is at least partially attenuated.

According to a third aspect the invention provides a compensation circuit for compensating for an offset voltage that is present in a differential output signal output by a resistive force sensor, the compensation circuit comprising:
  voltage divider circuitry comprising a plurality of resistances, the voltage divider circuitry configured to receive a bias voltage that is also supplied to the force sensor and to output a control voltage derived from the bias voltage, wherein a ratio of resistances of the voltage divider circuitry is adjustable to correspond to a ratio of resistances of the force sensor;
  current generator circuitry configured to receive the control voltage and to generate a compensating current based on the received control voltage; and
  amplifier circuitry configured to receive the differential signal output by the force sensor and the compensating current and to output a compensated differential output signal in which the offset voltage is at least partially cancelled.

According to a fourth aspect the invention provides a compensation circuit for compensating for an offset voltage that is present in a first and/or a second output signal output by a resistive force sensor, the compensation circuit comprising:
  first voltage divider circuitry comprising a plurality of resistances, the first voltage divider circuitry configured to receive a bias voltage that is also supplied to the force sensor and to output a first control voltage derived from the bias voltage, wherein a ratio of resistances of the first voltage divider circuitry is adjustable to correspond to a ratio of resistances of a first voltage divider of the force sensor;
  second voltage divider circuitry comprising a plurality of resistances, the second voltage divider circuitry configured to receive a bias voltage that is also supplied to the force sensor and to output a second control voltage derived from the bias voltage, wherein a ratio of resistances of the second voltage divider circuitry is adjustable to correspond to a ratio of resistances of a second voltage divider of the force sensor;
  first current generator circuitry configured to receive the first control voltage and to generate a first compensating current based on the received control voltage;
  second current generator circuitry configured to receive the second control voltage and to generate a second compensating current based on the received control voltage; and
  amplifier circuitry configured to receive the first and second signals output by the force sensor and the first and second compensating currents and to output first and second compensated output signals in which the offset voltage is at least partially cancelled.

According to a fifth aspect the invention provides a force sensor circuit comprising:
  a resistive force sensor;
  a bias voltage generator circuitry coupled to the resistive force sensor to supply a bias voltage to the resistive force sensor; and
  compensation circuitry for compensating for an offset voltage that is present in a differential output signal output by the force sensor, the compensation circuit comprising:
    voltage divider circuitry, the voltage divider circuitry configured to receive the bias voltage and to output a control voltage derived from the bias voltage, wherein a component mismatch ratio of the voltage divider circuitry is adjustable to correspond to a component mismatch ratio of the force sensor;
    current generator circuitry configured to receive the control voltage and to generate a compensating current based on the received control voltage; and
    amplifier circuitry configured to receive the differential signal output by the force sensor and the compensating current and to output a compensated differential output signal in which the offset voltage is at least partially cancelled.

According to a sixth aspect the invention provides an integrated circuit comprising a force sensor circuit according to the fifth aspect.

According to a seventh aspect the invention provides a device comprising a force sensor circuit according to the fifth aspect.

The device may comprise, for example, a mobile telephone, a tablet computer, a laptop computer, a portable media player, a gaming device, a gaming controller, an in-vehicle entertainment system, or a battery powered device.

According to an eighth aspect the invention provides a force sensor circuit comprising:
- a resistive force sensor;
- a bias voltage generator circuitry coupled to the resistive force sensor to supply a bias voltage to the resistive force sensor; and
- compensation circuitry, the compensation circuitry comprising:
  - voltage divider circuitry, the voltage divider circuitry configured to receive a bias voltage that is also supplied to the force sensor and to output a control voltage derived from the bias voltage, wherein a ratio of the control voltage to the bias voltage is adjustable to correspond to a ratio of a quiescent differential output voltage of the force sensor to the bias voltage;
  - current generator circuitry configured to receive the control voltage and to generate a compensating current based on the received control voltage; and
  - amplifier circuitry configured to receive the differential signal output by the force sensor and the compensating current and to output a compensated differential output signal in which the offset voltage is at least partially attenuated.

According to a ninth aspect the invention provides a force sensor circuit comprising:
- a resistive force sensor;
- a bias voltage generator circuitry coupled to the resistive force sensor to supply a bias voltage to the resistive force sensor; and
- compensation circuitry, the compensation circuitry comprising:
  - voltage divider circuitry comprising a plurality of resistances, the voltage divider circuitry configured to receive a bias voltage that is also supplied to the force sensor and to output a control voltage derived from the bias voltage, wherein a ratio of resistances of the voltage divider circuitry is adjustable to correspond to a ratio of resistances of the force sensor;
  - current generator circuitry configured to receive the control voltage and to generate a compensating current based on the received control voltage; and
  - amplifier circuitry configured to receive the differential signal output by the force sensor and the compensating current and to output a compensated differential output signal in which the offset voltage is at least partially cancelled.

According to a tenth aspect the invention provides a force sensor circuit comprising:
- a resistive force sensor;
- a bias voltage generator circuitry coupled to the resistive force sensor to supply a bias voltage to the resistive force sensor; and
- compensation circuitry, the compensation circuitry comprising:
  - first voltage divider circuitry comprising a plurality of resistances, the first voltage divider circuitry configured to receive a bias voltage that is also supplied to the force sensor and to output a first control voltage derived from the bias voltage, wherein a ratio of resistances of the first voltage divider circuitry is adjustable to correspond to a ratio of resistances of a first voltage divider of the force sensor;
  - second voltage divider circuitry comprising a plurality of resistances, the second voltage divider circuitry configured to receive a bias voltage that is also supplied to the force sensor and to output a second control voltage derived from the bias voltage, wherein a ratio of resistances of the second voltage divider circuitry is adjustable to correspond to a ratio of resistances of a second voltage divider of the force sensor;
  - first current generator circuitry configured to receive the first control voltage and to generate a first compensating current based on the received control voltage;
  - second current generator circuitry configured to receive the second control voltage and to generate a second compensating current based on the received control voltage; and
  - amplifier circuitry configured to receive the first and second signals output by the force sensor and the first and second compensating currents and to output first and second compensated output signals in which the offset voltage is at least partially cancelled.

According to an eleventh aspect the invention provides force sensor system comprising:
- force sensor circuitry configured to receive a bias voltage and to output a force sensor output signal containing an offset component;
- compensation circuitry configured to receive the bias voltage and to output a compensation signal for compensating for the offset component of the force sensor output signal; and
- amplifier or buffer circuitry configured to receive the force sensor output signal and to output a compensated output signal in which the offset in the force sensor output signal has been at least partially removed or compensated.

The force sensor system may further comprise:
- a controller operative to receive the compensated output signal and to output a control signal to the compensation circuitry to control a parameter of the compensation circuitry based on the compensated signal output by the amplifier or buffer circuitry so as to adjust the compensation signal output by the compensation circuitry.

The force sensor circuitry may comprises single ended resistive force sensor circuitry.

An output of the force sensor circuitry may be coupled to a first input of the amplifier or buffer circuitry and an output of the compensation circuitry may be coupled to a second input of the amplifier or buffer circuitry.

An output of the force sensor circuitry may be coupled to an output of the compensation circuitry, and the output of the compensation circuitry may be coupled to an input of the amplifier or buffer circuitry.

BRIEF DESCRIPTION OF THE DRAWINGS

Embodiments of the invention will now be described, strictly by way of example only, with reference to the accompanying drawings, of which.

DETAILED DESCRIPTION

Figure 1:
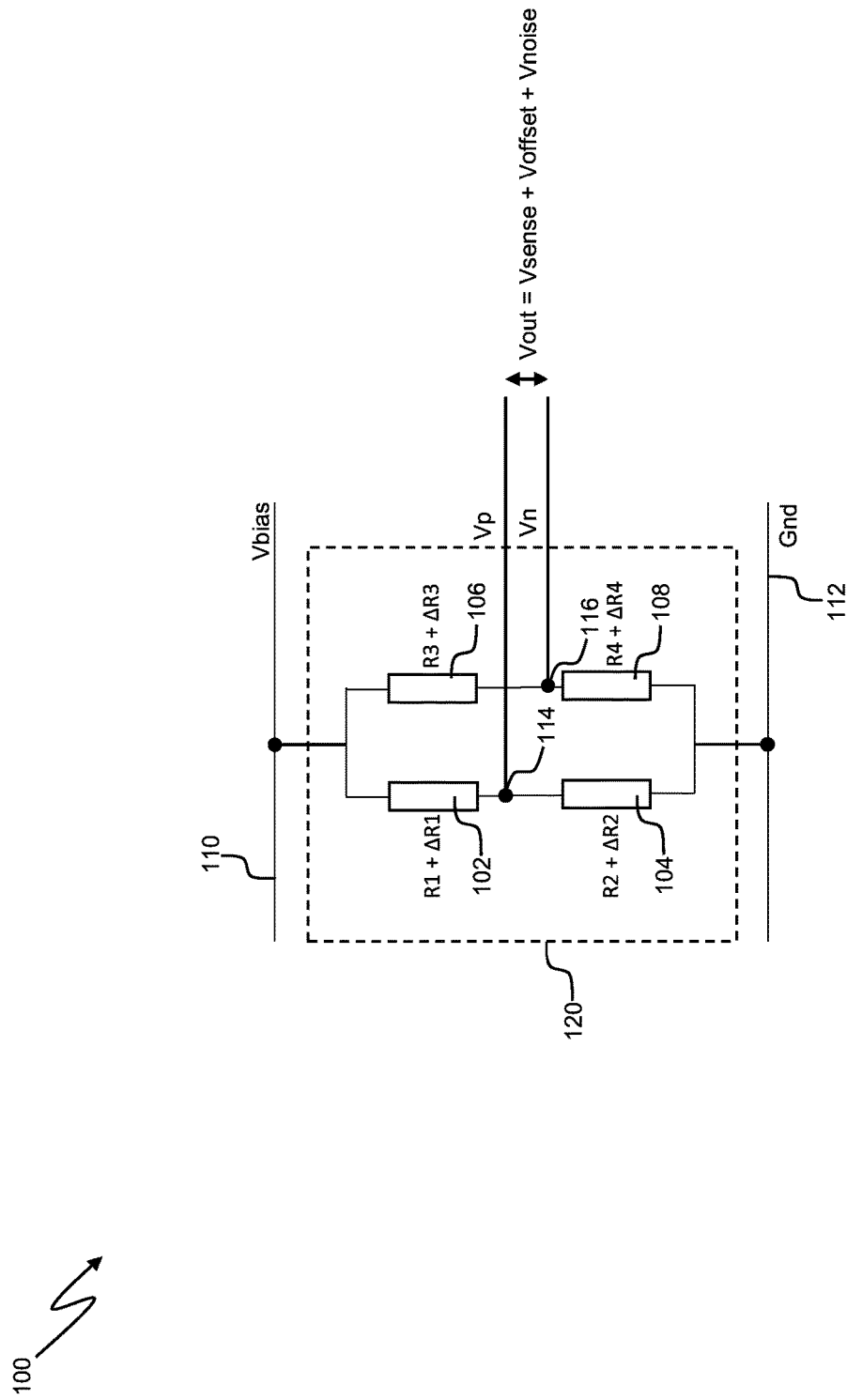
FIG. 1 is a schematic representation of a differential resistive force sensor.

Referring first to FIG. 1, a force sensor is shown generally at 100. In the illustrated example the force sensor 100 is a resistive force sensor, comprising first, second, third and fourth resistances 102, 104, 106, 108 arranged in a Wheatstone bridge configuration (shown in dashed outline at 120). Thus, the first and second resistances 102, 104 are connected in series between a first supply rail or terminal 110 that receives a bias voltage Vbias from a voltage source such as a battery (typically via a regulator such as a low dropout regulator (LDO)) and a second supply rail or terminal 112 that is coupled to a reference voltage such as ground (Gnd), forming a first resistive voltage divider that develops a first output voltage Vp at a node 114 between the series-connected first and second resistances 102, 104. Similarly, the third and fourth resistances 106, 108 are connected in series between the first supply rail or terminal 110 and the second supply rail or terminal 112, forming a second resistive voltage divider (in parallel with the first voltage divider) that develops a second output voltage Vn at a node 116 between the series-connected third and fourth resistances 106, 108.

The resistances 102, 104, 106, 108 are selected such that a ratio of the first resistance 102 to the second resistance 104 is equal to a ratio of the third resistance 106 to the fourth resistance 108, i.e. R1:R2=R3:R4. Thus, in use of the force sensor 100, when no force is applied to the force sensor 100, the value of the first output voltage Vp is equal to the value of the second output voltage Vn, such that a differential output voltage Vout (i.e. Vp−Vn) of the force sensor 100 equals zero. When a force is applied to the force sensor 100, the value of one or more of the resistances 102, 104, 106, 108 changes, such that the value of the first output voltage Vp differs from that of the second output voltage Vp and thus the differential output voltage Vout of the force sensor 100 takes some non-zero value, which is dependent upon the amount of force applied. In this way the force sensor 100 is able to output a differential sensor output voltage signal Vout that includes a wanted signal Vsense that is indicative of the magnitude of a force applied to the force sensor 100. The sensor output voltage Vout may also include unwanted offset (Voffset) and noise (Vnoise) signal components, as will be described in more detail below. The signal Vsense can be processed by downstream signal processing components of a system or device incorporating the force sensor 100 (such as amplifiers, filters and the like) to produce a desired output signal.

One issue that can arise with resistive force sensors of the kind described above with reference to FIG. 1 is that, due to factors such as manufacturing tolerances that apply to the resistance values of the resistances 102, 104, 106, 108, systemic mismatches, ageing and/or environmental conditions of and/or in the vicinity of the force sensor 100, it is impossible to ensure that in use of the force sensor 100 the ratio of the first and second resistances 102, 104 (i.e. R1:R2) is exactly equal to the ratio of the third and fourth resistances 106, 108 (i.e. R3:R4).

To illustrate this, assume that the first resistance 102 has a notional resistance value R1. In practice, due to factors such as those discussed above, the actual resistance value of the first resistance 102 will be R1+ΔR1, where R1 is the notional resistance value and ΔR1 represents a difference between the notional resistance value R1 and the actual resistance value. It is to be understood that the ΔR1 term could be positive or negative, i.e. the actual resistance value of the first resistance 102 may be greater than or less than the notional resistance value R1. Similarly, the second, third and fourth resistances 104, 106, 108 may have respective notional resistance values of R2, R3, R4, but actual resistance values of R2+ΔR2, R3+ΔR3, R4+ΔR4. Consequently there will be a mismatch between a ratio of the first resistance 102 to the second resistance 104 and a ratio of the third resistance 106 to the fourth resistance 106, $$\text{i.e. } \frac{R1 + \Delta R1}{R2 + \Delta R2} \neq \frac{R3 + \Delta R3}{R4 + \Delta R4}.$$

As a result, even in a quiescent state in which no force is applied to the force sensor 100, in use of the force sensor 100 there will be a difference between the first and second output voltages Vp, Vn, and thus an output signal Voutq of the force sensor 100 in this quiescent state will include a non-zero DC offset voltage Voffset in addition to the wanted differential sensor output voltage signal Vsense that is indicative of the magnitude of a force applied to the force sensor.

This is also true for the case where a single-ended force sensor is used in place of the differential force sensor shown in FIG. 1. A single-ended force sensor typically includes first and second resistances of notionally equal resistance values connected in series between a bias voltage (Vbias) node and a reference such as ground. An output of the force sensor is coupled to a node between the first and second resistances. In such an arrangement (assuming that the resistance values of the first and second resistances are equal) a quiescent output voltage Voutq (i.e. the output voltage when no force is applied to the force sensor, also referred to as a zero-force reference) will be Vbias/2. However, in practice the resistance values of the first and second resistances will not be matched, due to factors such as those described above, and thus in use of such a single-ended force sensor its output will also include a non-zero DC offset voltage component in addition to the wanted sensor output voltage signal.

In applications where the force sensor 100 is used as a user input transducer in place of a mechanical switch or button to detect a user input, a user input (e.g. press on the force sensor 100) may cause the force sensor 100 to produce a differential sensor output voltage Vsense having a magnitude of the order of microvolts, whereas the DC offset voltage Voffset output by the force sensor 100 as a result of mismatch between the ratios of the resistances (i.e. R1:R2 and R3:R4) of the first and second voltage dividers (i.e. 102, 104 and 106, 108) may be of the order of hundreds of millivolts. As will be appreciated, because of the very low magnitude of the wanted sensor output voltage signal Vsense, in any downstream processing, gain must be applied to the wanted signal Vsense in order to amplify it for subsequent processing. However, any gain applied will also amplify the DC offset voltage Voffset and any noise Vnoise, making detection, conditioning and processing of the wanted differential sensor output voltage signal Vsense very challenging.

In addition, even where a highly stable voltage source such as an LDO is used to provide the bias voltage Vbias, there will inevitably be some noise in the bias voltage Vbias, for example as a result of parasitic elements in a battery from which the bias voltage Vbias is derived by the LDO, parasitic elements in the layout of circuitry of a device incorporating the force sensor 100, TDM noise (also referred to as "bumblebee noise") and the like. Such noise sources will be known and understood by those of ordinary skill in the art.

As a result of the mismatch between the ratios of the resistances of the first and second voltage dividers of the force sensor 100, any such noise in the bias voltage (Vbias) will be incorporated as part of the overall differential output signal Vout output by the force sensor 100. Thus, in addition to the wanted differential sensor output voltage signal (Vsense) and the unwanted DC offset voltage (Voffset), the output Vout of the force sensor 100 will also contain an unwanted noise signal component (Vnoise). The undesirable noise component Vnoise can mask or corrupt the wanted signal Vsense and it is thus desirable to at least minimise noise in the bias voltage Vbias. However, even minimising noise in the bias voltage Vbias imposes prohibitive design requirements on a bias voltage generator such as an LDO used to generate the bias voltage Vbias.

Figures 2A, 2B:
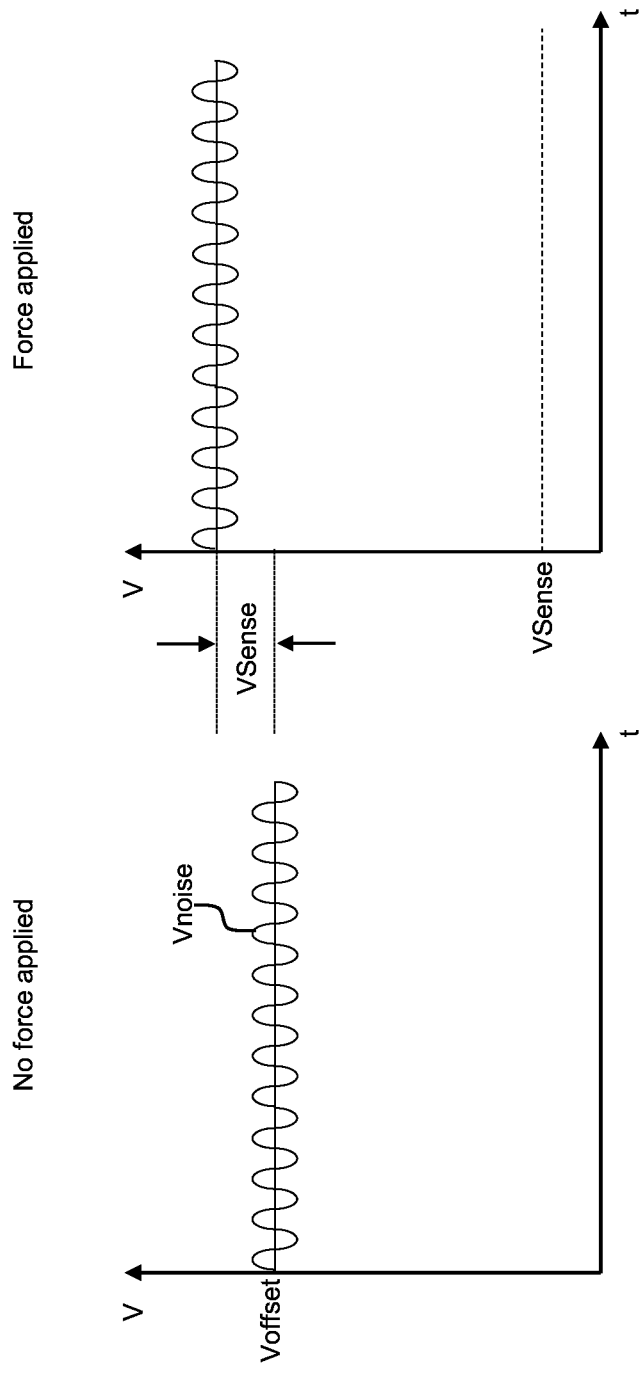
FIGS. 2a and 2b illustrate the presence of DC offset and noise components in the output of a force sensor.

FIGS. 2a and 2b illustrate graphically the wanted differential sensor output voltage signal component Vsense, the DC offset voltage component Voffset and the noise voltage component Vnoise in the voltage output signal Vout of the force sensor 100. As shown in FIG. 2a, when no force is applied to the force sensor 100, the output signal Vout includes a DC offset component Voffset and a noise component Vnoise but no sense signal component. When force is applied to the force sensor 100, e.g. when a user presses on the force sensor 100, a wanted sense signal component Vsense is present in the output signal Vout, but the wanted sense signal component Vsense is of much lower magnitude than the offset signal component Voffset. Thus, although the signals Vsense, Voffest and Vnoise are not shown to scale in FIG. 2b, the dominant effect of the signals Voffset and Vnoise in the force sensor output will be apparent from FIG. 2b.

Note that although the effects of DC offset and noise voltages (which may be referred to collectively as an "offset") present in the output signal Vout of a force sensor have been described above by reference to a resistive force sensor, similar effects may occur in other types of force sensor such as capacitive force sensors and piezoelectric force sensors.

Figure 3:
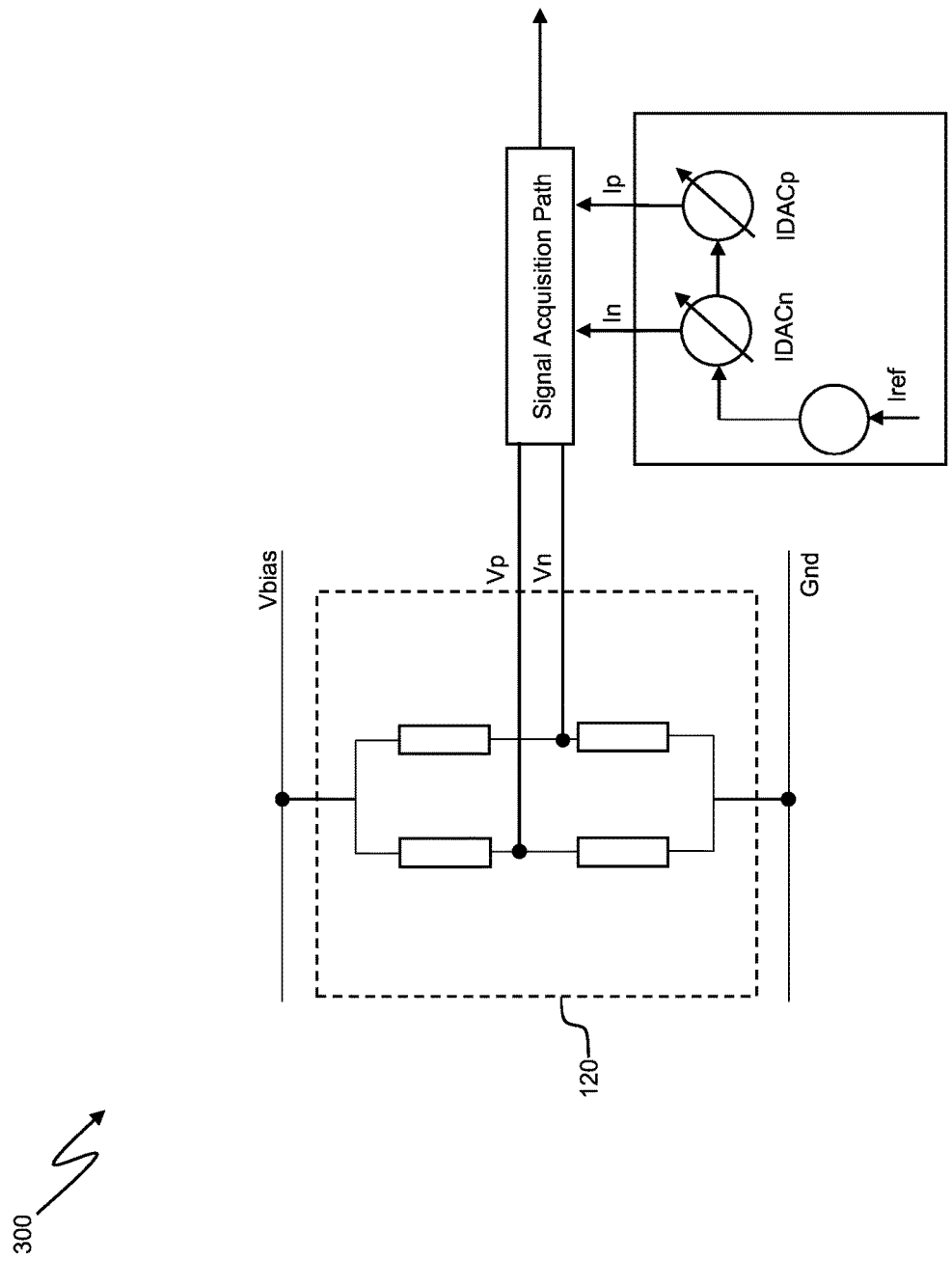
FIG. 3 schematically illustrates an approach to compensating for an offset in a sensor output signal.

A typical approach to cancelling or compensating for an offset voltage such as a DC offset voltage in a signal is to scale a reference current through selectable mirrored devices and to inject this scaled current into an amplifier stage of a signal acquisition path in order to cancel the offset voltage, i.e. a current digital to analogue converter (IDAC) based solution. The scaled current is applied to a resistor string in a programmable gain amplifier (PGA) of a signal acquisition path, which cancels the offset at the output of the PGA as a consequence of the amplifier adjusting its output to account for the IDAC current. This approach is illustrated schematically at 300 in FIG. 3.

However, this approach has a number of problems when the wanted sensor output voltage signal Vsense is very small compared to the offset voltage Voffset. In such circumstances the noise associated with the above-mentioned IDAC based solution would need to be extremely low (e.g. less than 1 microvolt rms). Device thermal noise alone would make the mirrored devices in such a solution prohibitively large. Additionally, in order to cover the range of output currents required to compensate for the range of possible offset magnitudes, high IDAC resolution (e.g. greater than 10 bit) is required, which makes the necessary current ratios produced by the mirrored devices difficult to achieve. Further, the IDAC requires different input DAC codes for different amplifier gain settings. Still further, this approach has no means for cancelling or mitigating the effects of power supply noise.

Thus, the typical approach described above does not provide a viable solution to the problem of mitigating the effects of an offset voltage, however it manifests itself, in the output voltage signal Vout of a force sensor.

Aspects of the present aim to mitigate the effects of such an offset in the output of a force sensor.

Figure 4:
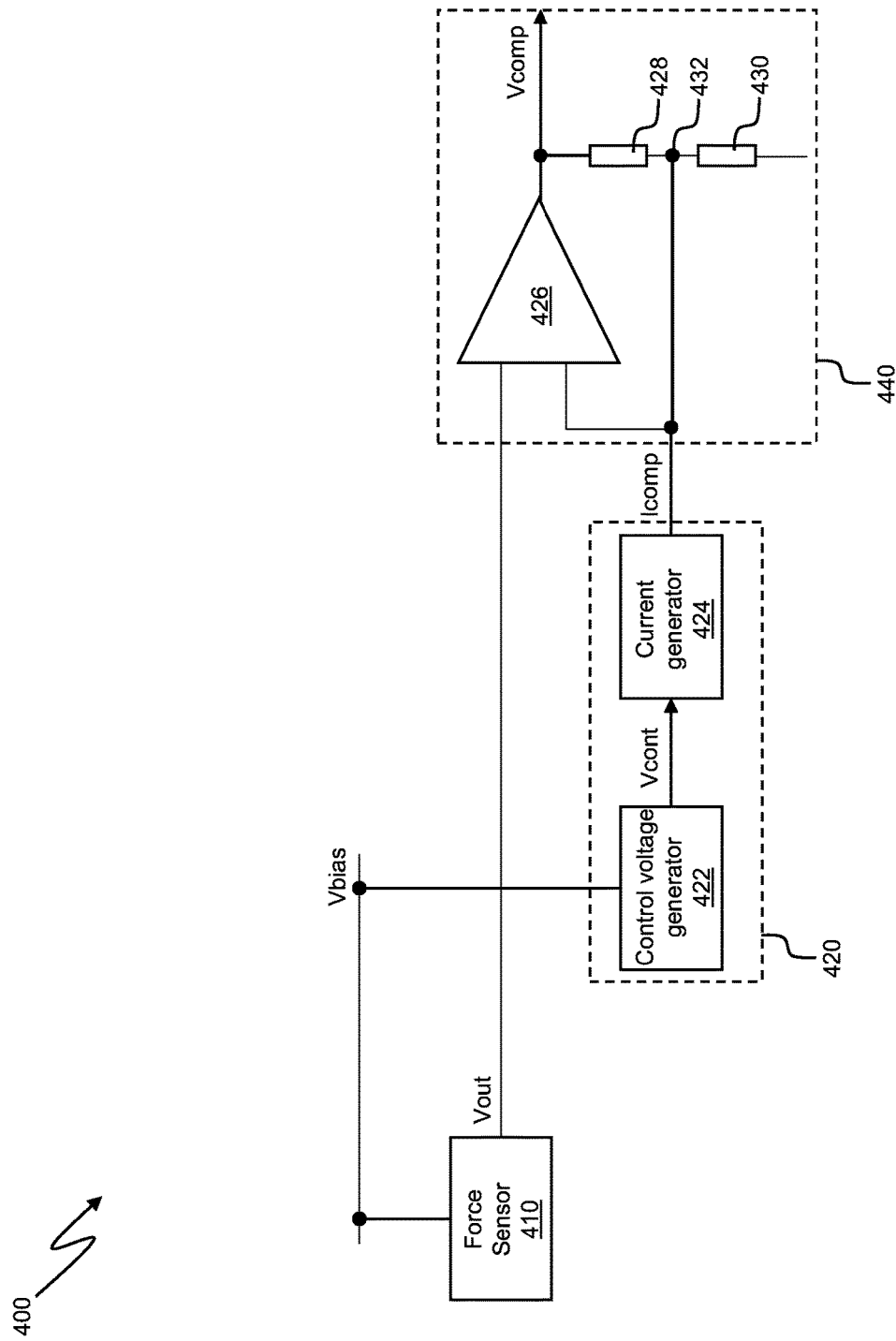
FIG. 4 is a schematic block diagram illustrating a force sensor system including compensation circuitry for compensating for DC offset and noise in the output of a force sensor.

FIG. 4 is a schematic block diagram illustrating a force sensor system that includes a compensation circuit for compensating for an offset (e.g. a DC offset and/or noise) in the output signal Vout from a force sensor. The diagram of FIG. 4 shows one half of a differential force sensor system arrangement.

The force sensor system, shown generally at 400 in FIG. 4, includes a force sensor 410 which may be, for example, a resistive force sensor of the kind described above with reference to FIG. 1, or may be some other kind of force sensor, e.g. a capacitive force sensor or a piezoelectric force sensor. The force sensor system 400 also includes a compensation circuit 420 for at least partially cancelling, reducing, attenuating or compensating for an offset such as a DC offset and/or noise in the output of the force sensor 410, and an acquisition circuit 440. An output of the compensation circuit 420 is input to the acquisition circuit 440, which may be configured to amplify the wanted sensor output voltage signal Vsense.

The compensation circuit 420 includes a control voltage generator 422 and a current generator 424.

The control voltage generator 422 receives a bias voltage Vbias, which is also supplied to the force sensor 410 to bias the force sensor 410. The control voltage generator 422 generates a control voltage Vcont based on the bias voltage Vbias. The control voltage generator 422 is configured such that a component mismatch ratio of the control voltage generator 422 can be adjusted to correspond to any component mismatch ratio of the force sensor 410. For example, the control voltage generator 422 may include control voltage generator components that are adjustable such that a ratio of the control voltage to the bias voltage (i.e. the ratio Vcont:Vbias) can be made to correspond to (e.g. to be equal to) a ratio of the quiescent differential output voltage Voutq of the force sensor 410 (i.e. the output voltage when no force is applied to the force sensor 410, as discussed above) to the bias voltage Vbias (i.e. the ratio Voutq:Vbias).

For example, where the force sensor 410 is a resistive force sensor of the kind described above with reference to FIG. 1, the control voltage generator 422 may comprise a resistive voltage divider that is configured to generate a differential output voltage derived from the bias voltage Vbias as the control voltage Vcont. In this case the values of the resistances that make up the resistive voltage divider of the control voltage generator 422 are adjustable such that a ratio of the resistances of the resistive voltage divider of the control voltage generator 422 can be adjusted so as to correspond to (e.g. be equal to) a ratio describing a mismatch between the resistances 102, 104, 106, 108 of the resistive force sensor 100, such that the ratio Vcont:Vbias can be made to be equal to the ratio Voutq:Vbias, as will be described in more detail below.

The control voltage Vcont is output by the control voltage generator 422 to a current generator 424, which is configured to generate a compensating current Icomp based on the control voltage Vcont. The combination of the control voltage generator and the current generator 424 constitutes a current digital to analogue converter (IDAC). In some implementations the current generator 424 may be omitted and the control voltage Vcont output by the control voltage generator 422 may be used directly, instead of generating a compensating current Icomp based on the control voltage Vcont.

A first input of the amplifier 426 is coupled to an output terminal of the force sensor 410 and so receives the output voltage Vout of the force sensor 410. An output of the amplifier 426 is coupled to a second input of the amplifier 426 via a feedback loop comprising first and second feedback resistances 428, 430 arranged as a voltage divider. Thus, a node 432 that couples the first feedback resistance 428 to the second feedback resistance 430 is coupled to the second input of the amplifier 426, and an output of the current generator 424 is coupled to the node 432 such that the compensating current Icomp is injected into the feedback loop so as to provide a cancellation current into the first and second feedback resistances 428, 430, with the amplifier 426 adjusting the output voltage signal Vcomp of the amplifier 426 to maintain the voltage, current, resistance (VCR) relationship. The amplifier 426 thus outputs a compensated voltage signal Vcomp in which the effect of the offset in the force sensor output signal Vout is at least partially cancelled or attenuated.

Because the control voltage generator 422 is configured such that the ratio Vcont:Vbias can be made to be linearly proportional to the ratio Voutq:Vbias, the compensated voltage signal Vcomp can be made to match the offset in the force sensor output Vout to a high degree of precision, and thus the offset can be removed or attenuated (at least partially if not completely) in the compensated signal Vcomp output by the amplifier 426.

Additionally, because the control voltage Vcont is derived from the bias voltage Vbias, any noise that is present in the bias voltage Vbias is also present in the control voltage Vcont. Thus, the effect of any noise that is present in the bias voltage Vbias is automatically compensated for (i.e. at least partially cancelled or attenuated) directly by Vcomp or, as in the example discussed above, by the compensating current Icomp that is generated based on Vcont.

Thus, the compensation circuit 420 provides an effective mechanism for cancelling or compensating for any offset voltage (e.g. a DC offset and/or power supply noise) in the differential output signal Vout of the force sensor 410.

Figure 5:
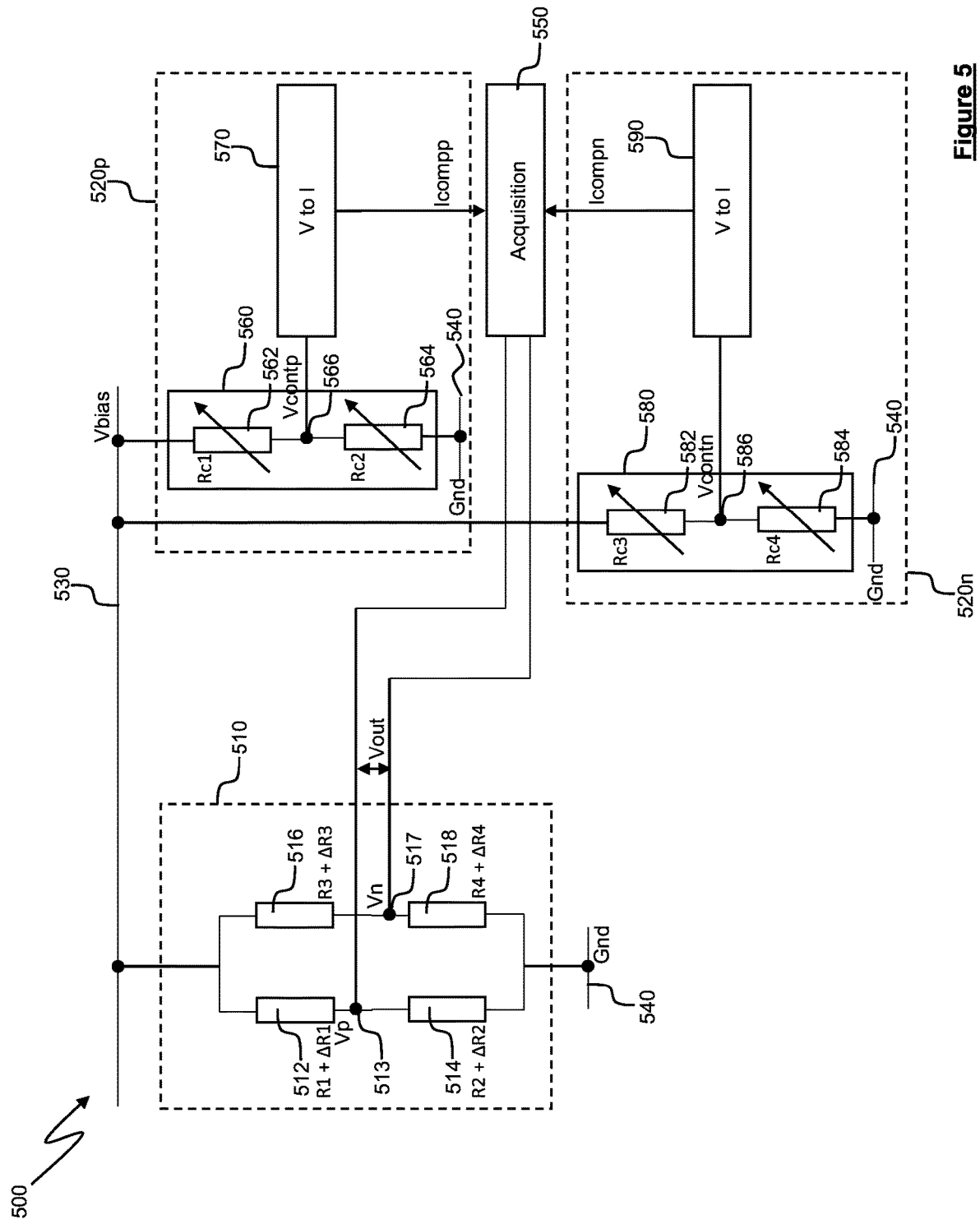
FIG. 5 is a schematic diagram illustrating a force sensor system including a differential implementation of compensation circuitry for compensating for offset in the output of a force sensor.

Referring now to FIG. 5, a force sensor system including one possible implementation of compensation circuitry for compensating for offset in the output signal of a force sensor is shown generally at 500, and comprises a force sensor 510 and compensation circuitry 520p, 520n configured to compensate for offset in the output of the force sensor 510.

The force sensor 510 includes first, second, third and fourth resistances 512, 514, 516, 518 arranged in a Wheatstone bridge configuration coupled between a first supply rail or terminal 530 that supplies a bias voltage Vbias and a second supply rail or terminal 540 that is coupled to a reference voltage such as ground, as described above with reference to the force sensor 100 of FIG. 1. Thus, a first output voltage Vp develops at a node 513 between the series-connected first and second resistances 512, 514 and a second output voltage Vn develops at a node 517 between the series-connected third and fourth resistances 516, 518.

The force sensor 510 outputs first and second output signals Vp, Vn forming a differential output signal Vout (i.e. Vout=Vp−Vn) to downstream sense signal acquisition circuitry 550, which conditions and/or processes the differential output signal Vout in order to acquire a signal Vsense that represents a force applied to the force sensor 510. Ideally the first and second voltage dividers of the force sensor 510 are balanced, in the sense that a ratio of the first resistance 512 to the second resistance 514 is equal to a ratio of the third resistance 516 to the fourth resistance 518

$$\left(\text{i.e. } \frac{R1 + \Delta R1}{R2 + \Delta R2} = \frac{R3 + \Delta R3}{R4 + \Delta R4}\right),$$

such that in a quiescent state, i.e. when no force is applied to the force sensor 510, the first output voltage Vp is equal to the second output voltage Vn such that the differential output voltage Vout is equal to zero. However, as explained above, in any practical implementation of the force sensor 510, factors such as component tolerances, environmental conditions and the like give rise to component imbalances in the force sensor 510, which in turn gives rise to an offset (which may include both a DC offset component arising as a result of the component imbalance and an AC component arising from noise such as power supply noise) in the differential output voltage Vout. This offset is undesirable for a number of reasons as described above.

The compensation circuitry 520p, 520n is configured to compensate, at least partially, for any offset in the differential output voltage Vout of the force sensor 510.

The compensation circuitry 520p includes a first voltage divider module 560, a first voltage to current (V to I) converter module 570, whilst the compensation circuitry 520n includes a second voltage divider module 580 and a second voltage to current (V to I) converter module 590.

The first voltage divider module 560 includes series-connected first and second variable resistances 562, 564, connected between the first supply rail or terminal 530 and the second supply rail or terminal 540 so as to form a voltage divider. A first output voltage Vcontp, derived from the bias voltage Vbias, develops at a node 566 between the first and second variable resistances 562, 564. This first output voltage Vcontp is input into the first voltage to current converter module 570 to control a current output by the first voltage to current converter module 570. Hence, the first output voltage Vcontp may be referred to as a first input control voltage.

The values of the variable resistances 562, 564 of the first voltage divider module 560 can be adjusted or varied such that a ratio of the value of the first resistance 562 to the value of the second resistance 564 corresponds to a ratio of the value of the first resistance 512 of the force sensor 510 to the value of the second resistance 514 of the force sensor 510

$$\left(\text{i.e. } \frac{Rc1}{Rc2} = \frac{R1 + \Delta R1}{R2 + \Delta R2}\right).$$

In the event that the first V to I converter module 570 includes a V to I scaling factor $$\frac{1}{N},$$

then $$\frac{Rc1}{Rc2} * N = \frac{R1 + \Delta R1}{R2 + \Delta R2}.$$

Similarly, the second voltage divider 580 includes series-connected first and second variable resistances 582, 584, connected between the first supply rail or terminal 530 and the second supply rail or terminal 540 so as to form a voltage divider. A second output voltage Vcontn, derived from the bias voltage Vbias, develops at a node 586 between the first and second variable resistances 582, 584. This second output voltage Vcontn is input into the second voltage to current converter module 590 to control a current output by the second voltage to current converter module 590. Hence, the second output voltage Vcontn may be referred to as a second input control voltage.

The values of the variable resistances 582, 584 of the second voltage divider module 580 can be adjusted or varied such that a ratio of the value of the first resistance 582 to the value of the second resistance 584 corresponds to a ratio of the value of the third resistance 516 of the force sensor 510 to the value of the fourth resistance 518 of the force sensor 510

$$\left(\text{i.e. } \frac{Rc3}{Rc4} = \frac{R3 + \Delta R3}{R4 + \Delta R4}\right).$$

Again, in the event that the second V to I converter module 590 includes a V to I scaling factor $$\frac{1}{N},$$

then $$\frac{Rc3}{Rc4} * N = \frac{R3 + \Delta R3}{R4 + \Delta R4}.$$

The first and second voltage to current converter modules 570, 590 receive the first and second control voltages respectively, and generate respective first and second compensating currents Icompp, Icompn, which are output to the acquisition circuitry 550, where they are used to compensate for the offset in the signal Vout output by the force sensor 510. For example, the first and second compensating currents Icompp, Icompn may be injected at appropriate nodes (e.g. in feedback loops) of respective amplifier circuits to generate cancellation voltages in those amplifier circuits that at least partially cancel, attenuate or compensate for the offset in the signal Vout output by the force sensor, as described above with reference to FIG. 4.

Figure 6:
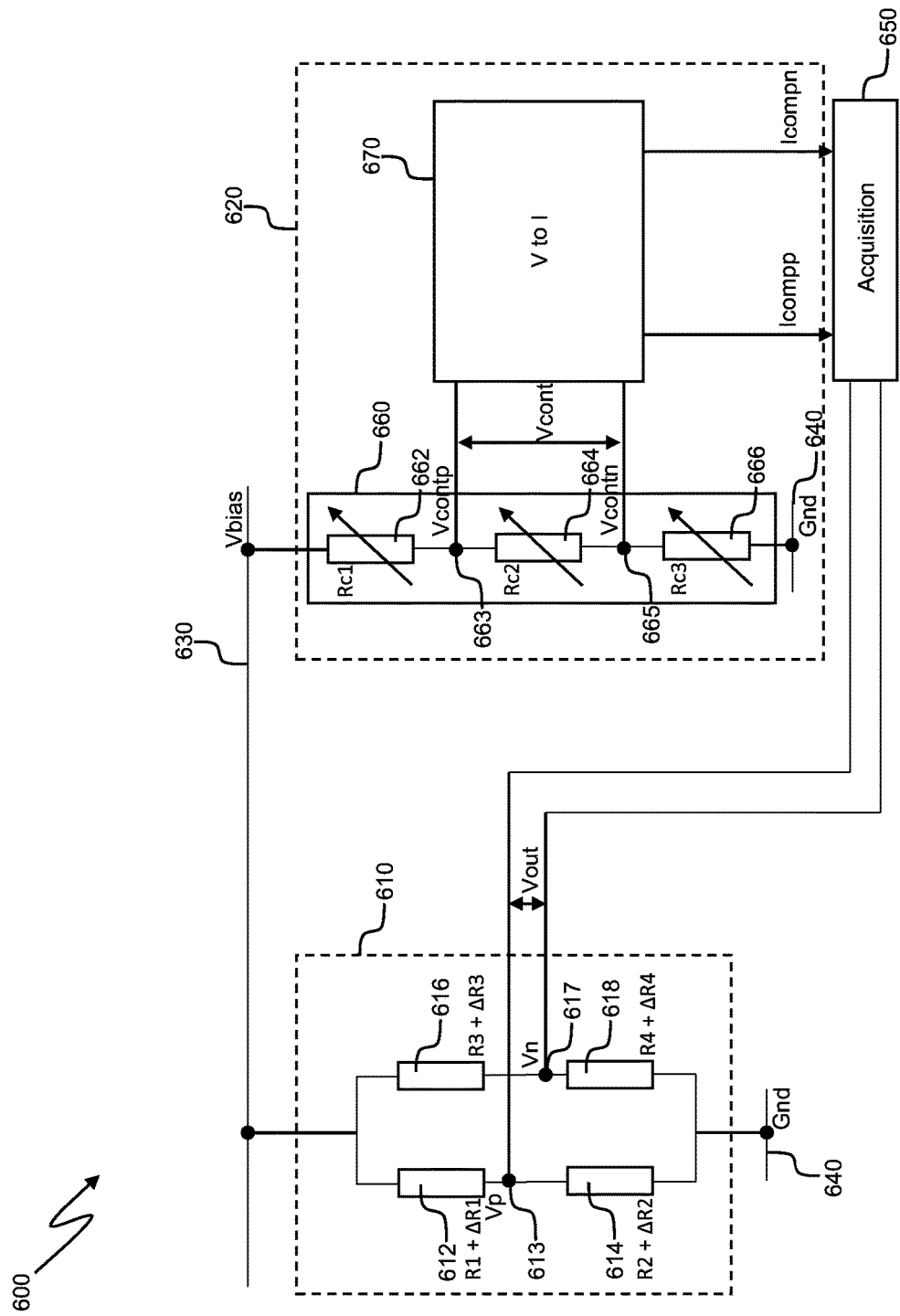
FIG. 6 is a schematic diagram illustrating a force sensor system including an alternative implementation of compensation circuitry for compensating for offset in the output of a force sensor.

FIG. 6 is a schematic diagram illustrating a force sensor system including an alternative implementation of compensation circuitry for compensating for offset in the output of a force sensor.

The force sensor system, shown generally at 600 in FIG. 6, includes a force sensor 610, which in this example is a resistive force sensor of the kind described above with reference to FIG. 1, and compensation circuitry 620 configured to compensate for offset in the output of the force sensor 610.

The force sensor 610 is similar to the force sensor 510 described above with reference to FIG. 5, and is coupled to a first rail or terminal 630 that receives a bias voltage Vbias from a voltage source such as a battery (typically via a regulator such as a low dropout regulator (LDO)) and a second supply rail or terminal 640 that is coupled to a reference voltage such as ground. The force sensor 610 outputs a differential output signal Vout representative of a force applied to the force sensor 610 (but which also includes a DC offset component and/or an AC component arising due to power supply noise or the like) to acquisition circuitry 650.

The compensation circuit 620 includes a differential voltage divider module 660 and a voltage to current converter module 670.

The voltage divider module 660 comprises first, second and third variable resistances 662, 664, 666 connected in series between the first supply rail or terminal 630 and the second supply rail or terminal 640. A first output voltage Vcontp derived from the bias voltage Vbias develops at a first node 663 between the first and second resistances 662, 664, and a second output voltage Vcontn, also derived from the bias voltage Vbias, develops at a second node 665 between the second and third resistances 664, 666. The voltage divider module 660 is thus able to output a differential output voltage Vcont (=Vcontp−Vcontn) derived from the bias voltage Vbias. This differential output voltage Vcont is input into the voltage to current converter module 670 to control a current output by the voltage to current converter module 670. Hence, the differential output voltage Vcont may be referred to as an input control voltage.

An advantage of the single voltage divider arrangement of the voltage divider module 660 over the two voltage divider modules 560, 580 used in the compensating circuitry 520 of FIG. 5 is that noise is reduced. In the two voltage divider networks or modules (i.e. 560 and 580) arrangement of FIG. 5, any noise arising as a result of the resistances of the modules 560, 580 sums to the respective output of each module 560, 580. This effect can be reduced by reducing the resistance values of the resistances of the networks 560, 580, but this comes at a cost of increased power consumption. In contrast, in the single voltage divider module 660 of the compensating circuitry 620 of FIG. 6, most of the noise in the voltage divider module 660 is common to the first and third variable resistances 660, 666, and thus cancels out in the differential output voltage Vcont output by the voltage divider module 660 as the input control voltage Vcont.

The values of the variable resistances 662, 664, 666 of the voltage divider module or network 660 can be adjusted or varied such that a difference between a ratio of the combined values Rc2, Rc3 of the second and third resistances 664, 666 to the combined values of the resistances Rc1, Rc2, Rc3 of the first, second and third resistances 662, 664, 666 and a ratio of the value Rc3 of the third resistance 666 to the combined values of the resistances Rc1, Rc2, Rc3 of the first, second and third resistances 662, 664, 666 (referred to as a calibration ratio, Cal_ratio) is equal to a difference between a ratio of the value of the first resistance 612 of the force sensor 610 to the value of the second resistance 614 of the force sensor and a ratio of the value of the third resistance 616 of the force sensor 610 to the value of the fourth resistance 618 of the force sensor 610 (referred to as a sensor ratio (Sensor_ratio)), i.e.:

$$\frac{Rc2 + Rc3}{Rc1 + Rc2 + Rc3} - \frac{Rc3}{Rc1 + Rc2 + Rc3} =$$
$$\text{Cal\_ratio} = \frac{R1 + \Delta R1}{R2 + \Delta R2} - \frac{R3 + \Delta R3}{R4 + \Delta R4} = \text{Sensor\_ratio}$$

In the event that the V to I converter module 670 includes a V to I scaling factor $$\frac{1}{N},$$

then N*Cal_ratio=Sensor_ratio.

Each variable resistance 662, 664, 666 may be implemented in a variety of ways, as will be described in more detail below. For example, each variable resistance may be implemented using a plurality of switchable resistances, e.g. switchable parallel resistances of appropriately weighted values, or switchable resistances of appropriately weighted values arranged in a ladder configuration such as an R–2R ladder.

The voltage to current converter module 670 receives the control voltage Vcont output by the voltage divider module 660, and generates compensating currents Icompp, Icompn, based on the received control voltage Vcont. The compensating currents Icompp, Icompn are output to the acquisition circuitry 650, where they are used to compensate for the offset in the signal Vout output by the force sensor 610. For example, the compensating currents Icompp, Icompn may be injected at appropriate nodes (e.g. in a feedback loop) of respective amplifier circuits such as programmable gain amplifier circuits to generate respective voltages that at least partially cancel, attenuate or compensate for the DC offset Voffset and/or the noise component Vnoise in the signal Vout that is output by the force sensor, as described above with reference to FIG. 4.

By adjusting the variable resistances 662, 664, 666 such that the ratios of resistance values correspond in this way, a ratio of the voltage Vcont to the bias voltage Vbias (i.e. the ratio Vcont:Vbias) can be made to correspond to a ratio of a quiescent output voltage Voutq of the force sensor 610 to the bias voltage Vbias (i.e. the ratio Voutq:Vbias). This ensures that the control voltage Vcont includes a component that corresponds to any DC offset Voffset that is present in the differential output signal Vout output by the force sensor 610, and thus that the compensating current Icomp (Icompp+Icompn), when applied to the acquisition circuitry 650, is able to compensate for such an offset.

Further, because the differential input control voltage Vcont is derived from the bias voltage Vbias but may include a V to I scaling factor $$\frac{1}{N},$$

its value will always track (within design constraints) that of Vbias, such that any AC and/or DC variation in Vbias arising as a result of noise, discharge, charging and the like will always be reflected in the control voltage Vcont. Thus, the compensating current Icomp (Icompp+Icompn), when applied to the acquisition circuitry 650, will also compensate for any such variation in Vbias.

Figure 7:
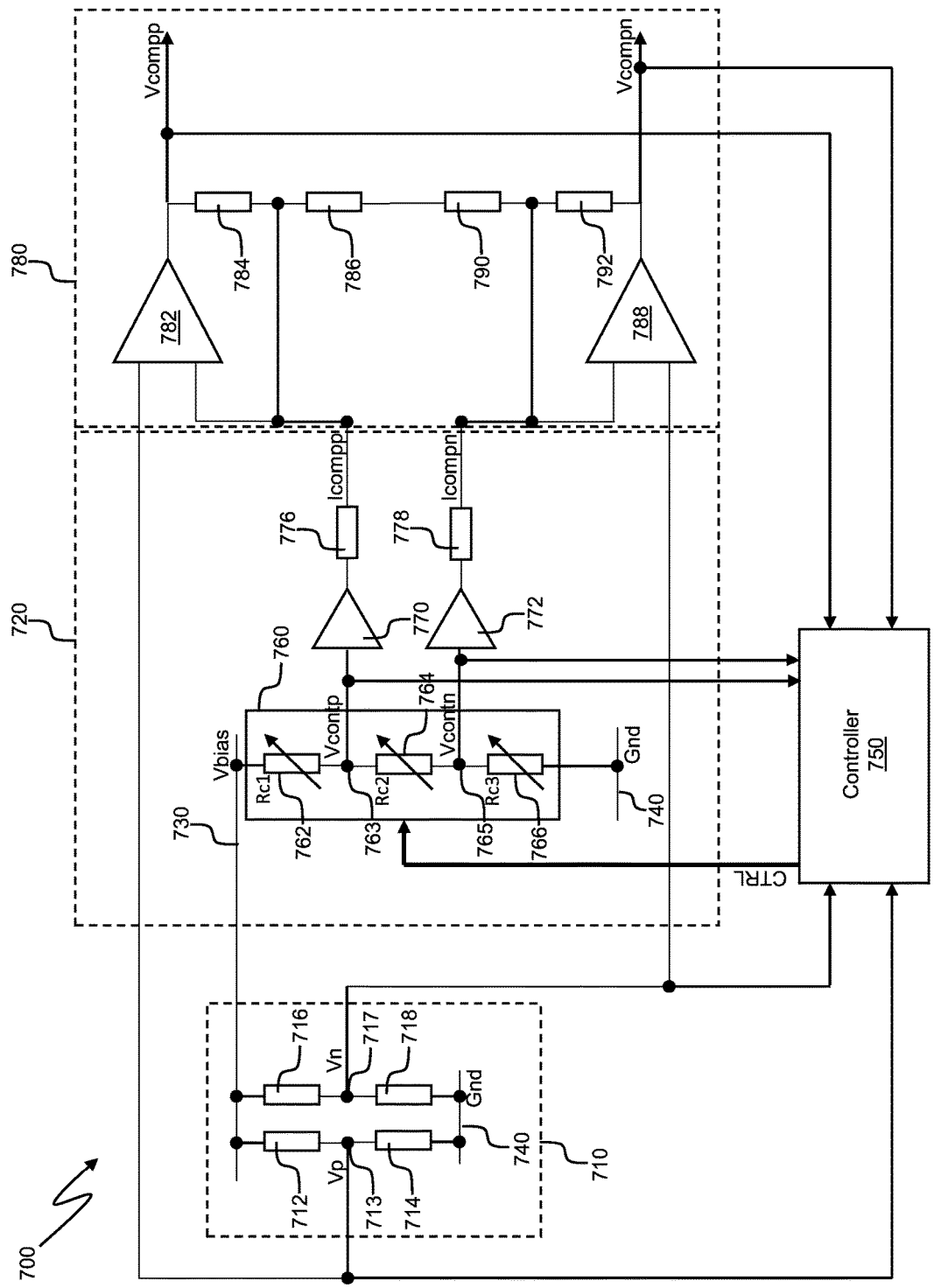
FIG. 7 is a schematic diagram illustrating further aspects of compensation circuitry for compensating for offset in the output of a force sensor.

FIG. 7 illustrates further aspects of compensation circuitry for compensating for offset in the output of a force sensor. FIG. 7 shows a force sensor system 700 including a force sensor 710, compensation circuitry 720, a controller 750 and acquisition circuitry 780.

The force sensor 710 is similar to the force sensor 510 described above with reference to FIG. 5, and outputs first and second output signals Vp, Vn representative of a force applied to the force sensor 710 (but which also include a DC offset component and/or an AC component arising due to power supply noise or the like) to the compensation circuitry 720, as will be described below.

The compensation circuitry 720 includes a differential voltage divider module 760, similar to the voltage divider module 660 described above with reference to FIG. 6. The voltage divider module 760 comprises first, second and third variable resistances 732, 734, 736 connected in series between the first supply rail or terminal 730 and the second supply rail or terminal 740. A first output voltage Vcontp derived from the bias voltage Vbias develops at a first node 763 between the first and second resistances 762, 764, and a second output voltage Vcontn, also derived from the bias voltage Vbias, develops at a second node 765 between the second and third variable resistances 764, 766.

The compensation circuitry 720 may include first and second amplifiers 770, 772 for converting the voltage signal into current by applying a voltage across first and second compensation resistances 776, 778. If a ratio gain factor N has been applied to the differential voltage divider module 760 in order to reduce further the impact of noise arising from the resistances of the voltage divider module 760 and first and second amplifiers 770, 772 by a factor equal to N, the first and second compensation resistances 776 and 778 will correspondingly by N times larger to correctly output the currents Icompp and Icompn.

The first node 763 is coupled to an input of either the first amplifier 770 or the second amplifier 772, depending upon the polarity of the offset.

Similarly, the second node 765 is coupled to an input of either the second amplifier 772 or the first amplifier 770, depending upon the polarity of the offset.

Outputs of the compensation circuitry 720 are coupled to inputs of the acquisition circuitry 780. The acquisition circuitry includes a first output amplifier (also referred to as a first acquisition amplifier) 782. A first input of the first output amplifier 782 is coupled to a node 713 between first and second resistances 712, 714 of the force sensor 710, such that the first input of the first output amplifier 782 receives the output signal Vp output by the force sensor 710. A first feedback resistance 784 is coupled to an output of the first output amplifier 782, and a second feedback resistance 786 is connected in series with the first feedback resistance 784. A node between the first and second feedback resistances 784, 786 is coupled to a second input of the first output amplifier 782. Thus the first and second feedback resistances 784, 786 form a feedback loop for the first output amplifier 782.

A second terminal of the first compensation resistance 776 is also coupled to the second input of the first output amplifier 782, such that a first compensating current Icompp output by the first output amplifier 770 via the first compensation resistance 776 can be injected into the feedback loop of the first amplifier 782 so as to generate a compensating or cancellation voltage to compensate for offset that is present in the output signal Vp output by the force sensor 710. Thus, the first output amplifier 782 outputs a compensated output signal Vcompp in which any offset that may be present in the signal Vp output by the force sensor 710 is at least partially cancelled, attenuated or reduced.

The acquisition circuitry 780 also includes a second output amplifier (also referred to as a second acquisition amplifier) 788. A first input of the second output amplifier 788 is coupled to a node 717 between third and fourth resistances 716, 718 of the force sensor 710, such that the first input of the second output amplifier 788 receives the output signal Vn output by the force sensor 710. A third feedback resistance 790 is coupled to an output of the second output amplifier 788, and a fourth feedback resistance 792 is connected in series with the third feedback resistance 790. A node between the third and fourth feedback resistances 790, 792 is coupled to a second input of the second output amplifier 788. Thus the third and fourth feedback resistances 790, 792 form a feedback loop for the second output amplifier 788.

A second terminal of the second compensation resistance 778 is also coupled to the second input of the second output amplifier 788, such that a second compensating current Icompn, derived from the bias voltage Vbias, output by the second output amplifier 772 via the second compensation resistance 778 can be injected into the feedback loop of the second output amplifier 788 so as to generate a compensating or cancellation voltage to compensate for offset that is present in the output signal Vn output by the force sensor 710. Thus, the second output amplifier 788 outputs a compensated output signal Vcompn in which any offset that may be present in the signal Vn output by the force sensor 710 is at least partially cancelled, attenuated or reduced.

The values of the first and second compensation resistances 776, 778 are selected so as to attenuate the voltage gain N of the voltage divider module 760 by a factor equal to N, so as to ensure that the level of the compensating voltage applied by the output amplifiers 782, 788 is sufficient to cancel or attenuate to a desired degree any offset that is present in the output of the force sensor 710. This can be achieved by selecting the value of the first compensation resistance 776 to be equal to the value of a parallel combination of the first and second feedback resistances 784, 786, and a multiple N of this value, where N is in a selected range from >1 to some upper value, and by selecting the value of the second compensation resistance 778 to be equal to the value of a parallel combination of the third and fourth feedback resistances 790, 792, and a multiple N of this value, where N is in a selected range from >1 to some upper value.

The controller 750 is used in calibration and re-calibration of the compensation circuitry 720. Thus, the controller 750 receives the first and second output signals Vp, Vn output by the force sensor 710. The controller 750 also receives the first and second output signals Vcontp, Vcontn output by the voltage divider module 760, and the first and second compensated output signals Vcompp, Vcompn output by the first and second output amplifiers 782, 788.

During an initial calibration of the compensation circuitry 720 the controller 750 monitors the quiescent output signal level of the signals Vp, Vn output by the force sensor 710, the levels of the output signals Vcontp, Vcontn output by the voltage divider module 760, and the output signals Vcompp and Vcompn. The controller 750 outputs one or more control signals CTRL to the voltage divider module 760 to respectively adjust the resistance value of one or more of the first, second and third variable resistances 762, 764, 766, until the controller 750 detects that the levels of the output signals Vcontp, Vcontn output by the voltage divider module 760 are indicative that Cal_ratio=Sensor_ratio.

As discussed above, the offset in the sensor output is not fixed, but varies due to component drift, environmental factors and the like. Thus, in order to maintain acceptable performance of the compensation circuitry 720, the compensation circuitry 720 may be recalibrated, periodically or in response to some trigger event or condition.

To this end, the controller 750 is configured to monitor the compensated output signals Vcompp, Vcompn output by the output amplifiers 782, 788 to detect an indication of the presence of any offset in the compensated output signals Vcompp, Vcompn by comparing these signals (or a differential signal derived from these output signals) to an offset threshold. If the offset threshold is reached, the controller 750 instigates the calibration process described above.

As indicated above, the variable resistances 762, 764, 766 of the voltage divider module or circuitry 760 may be implemented in a number of ways, as will now be discussed.

Figure 8:
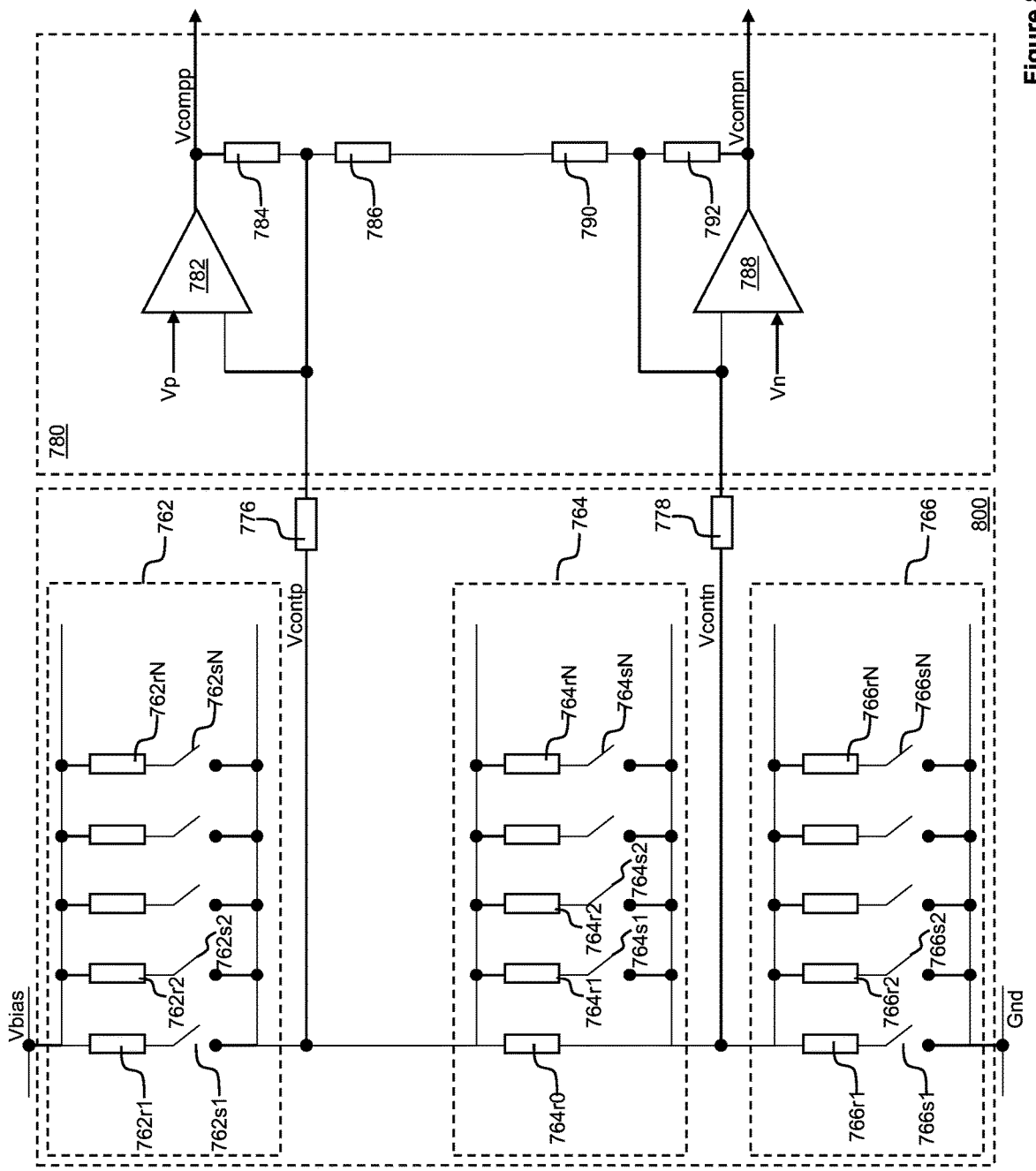
FIG. 8 is a schematic diagram illustrating an implementation of variable resistances of the compensation circuitry of FIGS. 5-7.

FIG. 8 is a schematic representation of one approach to implementing the variable resistances 762, 764, 766 of the voltage divider module 760. Thus, reference numerals used in FIG. 7 are also used in FIG. 8 to denote like elements. For the sake of clarity some elements of FIG. 7 have been omitted from FIG. 8.

In the approach illustrated in FIG. 8, each of the variable resistances 762, 764, 766 of the voltage divider resistance network 760 is implemented as a variable resistance array containing plurality of individually selectable resistances connected in parallel.

Thus, the variable resistance 762 is implemented as an array comprising a plurality of resistances 762$r$1-762$r$N of weighted resistance values connected in parallel. Each of the plurality of resistances 762$r$1-762$r$N is coupled in series with a respective controllable selector switch 762$s$1-762$s$N, which can be actuated in response to a control signal (e.g. from the controller 750) to select or deselect the associated resistance.

Similarly, the variable resistance 764 is implemented as an array comprising a plurality of resistances 764$r$1-764$r$N of weighted resistance values connected in parallel. Each of the plurality of resistances 764$r$1-764$r$N is coupled in series with a respective controllable selector switch 764$s$1-764$s$N, which can be actuated in response to a control signal (e.g. from the controller 750) to select or deselect the associated resistance, and the variable resistance 766 is implemented as an array comprising a plurality of resistances 766$r$1-766$r$N of weighted resistance values connected in parallel. Each of the plurality of resistances 766$r$1-766$r$N is coupled in series with a respective controllable selector switch 766s1-766sN, which can be actuated in response to a control signal (e.g. from the controller 750) to select or deselect the associated resistance.

As will be appreciated by those skilled in the art, when the variable resistances 762, 764, 766 are implemented in this manner, the combination of the variable resistances 762, 764, 766 (and the first and second amplifiers 770, 772 and the first and second compensation resistances 776, 778, where provided) constitutes a "current digital to analogue converter (IDAC)", as indicated by 800 in FIG. 8. The resolution of the IDAC 800 is determined by the number of parallel resistances 762r1-762rN, 764r1-764rN, 766r1-766rN that make up each of the variable resistances 762, 764, 766 and their relative resistance values or weightings.

In a conventional IDAC the values of the resistances are selected such that the value or level of the analogue output signal produced by the IDAC increases as the value of the input DAC code increases, i.e. the IDAC is designed to exhibit monotonic behaviour. For example, the values of the resistances may be weighted according to a binary weighting scheme.

Figure 9:
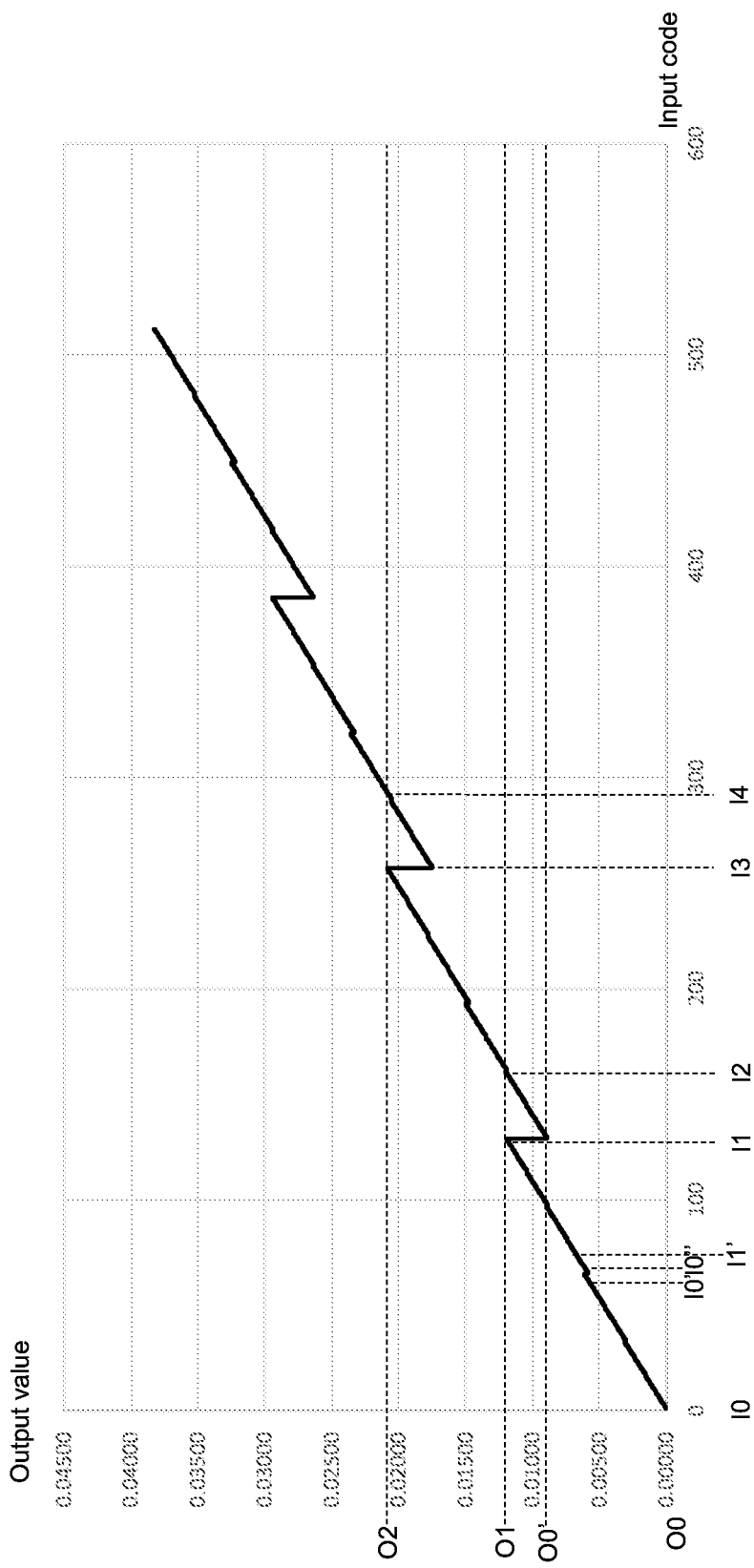
FIG. 9 is a graphical representation of a non-monotonic digital to analogue converter output characteristic.

In contrast, in the IDAC arrangement of the present disclosure, the values of the resistances 762r1-762rN, 764r1-764rN, 766r1-766rN are intentionally selected or configured such that an input-output characteristic of the IDAC 800 is non-monotonic, i.e. the IDAC 800 is intentionally designed to be a non-monotonic IDAC. Thus, in the IDAC 800 two or more, i.e. a plurality of, different input DAC codes may produce the same output analogue signal. An example non-monotonic DAC input-output characteristic is illustrated in FIG. 9, which shows that, in this example, a first DAC output signal value O1 can be produced from two different input DAC codes I1, I2 and that a second DAC output signal value O2 can also be produced from two different input DAC codes I3, I4.

Intentionally designing the IDAC 800 to have a non-monotonic input-output characteristic offers a number of benefits, as will be described in more detail below.

It will be recalled that the purpose of the variable resistances 762, 764, 766 is to provide a resistance mismatch ratio that corresponds to a component mismatch ratio of the force sensor, e.g. a resistance mismatch ratio of the resistances 712, 714, 716, 718 of the force sensor 710, so as to generate a control voltage based on Vbias, that can in turn produce a compensating current to be injected into the amplifier circuitry to generate a compensation or cancellation voltage to compensate for a voltage offset in the force sensor output signal arising from component mismatches in the force sensor 710 and/or noise and/or variation in the bias voltage Vbias.

In such an application, the range of possible voltage offsets in the force sensor output signal that must be compensated for may be large, for example, +/−300 millivolts, compared to a DAC output step size, which may be of the order of 30 microvolts, for example (i.e. 0.01% of the possible offset range). Achieving this comparatively large range and comparatively small step size with a conventional parallel switched resistance array or a serial tapped resistor string in a conventional monotonic DAC would require both small resistances and extremely large resistances in the array, and the matching of the resistances must be at least as good as the bit depth of the DAC, to provide compensation for very small (~0V) offset values and to achieve the 30 µV step size.

The non-monotonic DAC 800 alleviates these requirements, by compensating for poor resistance matching through non-monotonic overlap, i.e. a regressive input-output characteristic, of the compensating currents Icompp, Icompn. Adjusting the variable resistances 762, 766 (by selectively actuating the switches 762s1-762sN, 766s1-766sN) provides compensating currents Icompp, Icompn in a non-monotonic range, such that the compensating currents Icompp, Icompn lie within one of a plurality of relatively broad subranges of output currents that produce a corresponding plurality of relatively broad overlapping compensating voltage subranges, i.e. regressive overlapping compensating voltage subranges, when injected into the output amplifier circuitry. By adjusting the variable resistance 764 (by selectively actuating the switches 764s1-764sN) the compensating currents Icompp, Icompn can be refined, so as to achieve compensating currents Icompp, Icompn that give rise to a desired level of precision in the compensation or cancellation voltage generated by the amplifier circuitry to at least partially cancel or compensate for the offset.

As will be appreciated by those skilled in the art, the example shown in FIG. 8 is just one example of non-monotonic DAC architecture, and a non-monotonic DAC can be implemented in a wide variety of other ways, for example using a resistor ladder arrangement, one or more switched capacitor arrays or one or more switched current source arrays in place of the switched resistance arrays shown in FIG. 8. Moreover, although the non-monotonic DAC of FIG. 8 is described as a current DAC, other types of DAC (e.g. a voltage-output DAC) could equally be used.

As shown in FIG. 9, the non-monotonic input-output characteristic of the DAC or IDAC exhibits overlapping output subranges that exhibit regressive behaviour in portions of the input-output characteristic. For example, for input codes between I1 and I2, the input-output characteristic is regressive, in the sense that at I1 the output value O0' returns or regresses to a level that also occurred at an "earlier" input code, i.e. an input code representing a decimal number that is lower than a decimal number represented by the input code I1. Only when the input code exceeds I2 does the output value begin to adopt values that were not output for "earlier" input codes. Similarly, for input codes between I3 and I4, the input-output characteristic is regressive. Only when the input code exceeds I4 does the output value begin to adopt values that were not output for "earlier" input codes.

In other words, the non-monotonic input-output characteristic of the DAC or IDAC includes or exhibits overlapping output subranges that return to a lower or less developed state (i.e. regress) in portions of the input-output characteristic.

Put another way, the non-monotonic input-output characteristic of the DAC or IDAC includes or exhibits overlapping subranges that revert back to previous values in portions of the input-output characteristic.

Thus, the non-monotonic input-output characteristic of the DAC or IDAC exhibits overlapping subranges that return to previous values in portions of the input characteristic.

Accordingly, for portions of the range of input DAC codes, the value of the output of the DAC or IDAC will overlap with the value of the output of the DAC of IDAC for "earlier" or lower value input DAC codes.

As discussed above, during an initial calibration and any subsequent recalibration of the compensation circuitry 720 the controller 750 outputs control signals CTRL to the voltage divider module 760 to adjust the resistance of one or more of the first, second and third variable resistances 762, 764, 766, until desired resistance ratios are achieved.

Figure 10:
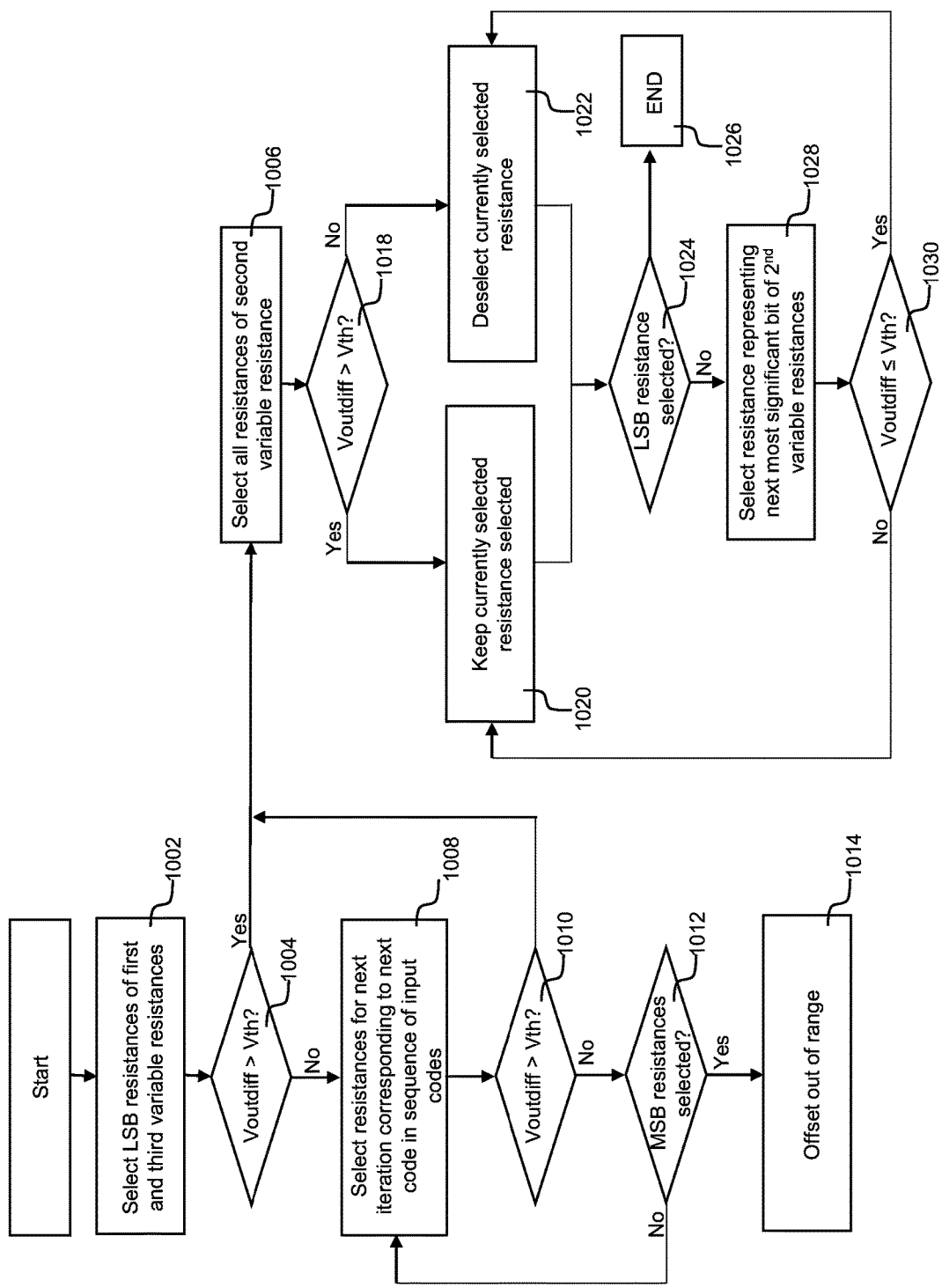
FIG. 10 is a flow chart illustrating steps performed in a binary search process.

Thus, to calibrate compensation circuitry incorporating switched resistance arrays of the kind illustrated in FIG. 8, the controller 750 is operative to output control signals CTRL to the voltage divider module 760 to perform a form of binary search for a desired resistance ratio, by sequentially actuating the controllable selector switches 762s1-762sN, 764s1-764sN, 766s1-766sN until the desired resistance ratio is achieved, as will now be described with reference to FIG. 10, which is a flow chart illustrating steps performed by the controller to perform the binary search process.

For the purpose of explaining the binary search process it will be assumed that the resistances 762r1-762rN, 764r1-764rN, 766r1-764rN are binary weighted, such that the first resistances 762r1, 764r1, 766r1 of the first, second and third variable resistance arrays 762, 764, 766 respectively represent a most significant bit (MSB) of the resistance value of the first, second and third variable resistance arrays 762, 764, 766, and the last resistances 762rN, 764rN, 764rN of the first, second and third variable resistance arrays 762, 764, 766 respectively represent a least significant bit (LSB) of the resistance value of the first, second and third variable resistance arrays 762, 764, 766. However, it is to be appreciated that in fact the weightings of the resistances 762r1-762rN, 764r1-764rN, 766r1-764rN will actually be selected so as to produce a non-monotonic input-output characteristic, and thus will not necessarily follow a binary weighting scheme.

The binary search process first steps through an incrementally increasing sequence of input codes for the first and third variable resistances to identify a resistance value for the first and third variable resistances 762, 766 that provides a compensating voltage within a broad range that is suitable for compensating for the offset in the sensor output signal. Once a suitable resistance value has been found for the first and third variable resistances 762, 766, the binary search process steps through an incrementally decreasing sequence of input codes for the second variable resistance to identify a resistance value that refines the compensating voltage to a level that is as close as possible to the offset in the sensor output signal, such that the combination of the identified resistance values for the first and third variable resistances 762, 766 and the identified resistance value for the second variable resistance 764 provides compensation for any offset in the sensor output signal that is within the desired LSB resolution.

The binary search process commences at step 1002 with the controller 750 issuing control signals to the voltage divider module 760 to actuate (i.e. close) the controllable selector switches 762sN, 766sN of the first and third variable resistances 762, 766 and to open the other controllable selector switches of the first and third variable resistances 762, 766. The controller 750 also issues control signals to open the controllable selector switches 764s1-764sN of the second variable resistance 764. For example, if the first and third variable resistances 762, 766 each comprise four selectable resistances in parallel, the controller 750 may issue a control signal in the form of a binary code with the value 0001 to the first and third variable resistances 762, 766.

Thus, the resistances 762rN, 766rN representing the least significant bits (LSBs) of the first and third variable resistance arrays 762, 766 are initially selected and a first iteration of a first resistance adjustment process, for adjusting the resistances of the first and third variable resistances 762, 766, can be performed.

With these resistances selected, the controller 750 compares (step 1004) the differential output Voutdiff (=Vcontp−Vcontn) of the voltage divider module 760 to a predetermined threshold Vth (which may be, for example, 0V). If the differential output Voutdiff is greater than the threshold Vth then the binary search process moves to a second resistance adjustment process at step 1006, which is described in more detail below. In alternative implementations the controller may compare one or more other signal values, e.g. Icompp, Icompn, Vcompp, Vcompn to appropriate thresholds.

If the differential output Voutdiff is less than (or equal to) the threshold Vth then at step 1008 the controller 750 issues control signals corresponding to the next code in the sequence of input codes to the first and third variable resistances 762, 766 to select the resistances for use in the next iteration of the first resistance adjustment process. For example, the controller 750 may issue a control signal in the form of a binary code with the value 0010 to select the resistances for use in the second iteration of the first resistance adjustment process, and may issue a control signal in the form of a binary code with the value 0100 to select the resistances for use in the third iteration of the first resistance adjustment process, and so on. Of course, the skilled person will appreciate that in an alternative configuration the controller 750 could issue control signals based on the differential output Voutdiff being equal to or greater than a threshold.

With the appropriate resistances selected, the controller 750 compares (step 1010) the differential output Voutdiff of the voltage divider module 760 to the predetermined threshold Vth. If the differential output Voutdiff is greater than the threshold Vth then the binary search process moves to the second resistance adjustment process at step 1006.

If the differential output Voutdiff is less than (or equal to) the threshold Vth and the resistances representing the most significant bits (MSBs) of the first and third variable resistance arrays 762, 766 are currently selected (represented by step 1012 in FIG. 10) then the controller 750 determines that the offset voltage is out of range (step 1014). If the resistances representing the most significant bits (MSBs) of the first and third variable resistance arrays 762, 766 are not currently selected the process returns to step 1008, at which the controller 750 issues appropriate control signals to select the resistances to be used for the next iteration of the first resistance adjustment process. Steps 1010, 1012 and 1008 are repeated until either the differential output exceeds the threshold Vth (at which point the process moves to the second adjustment process at step 1006) or the controller 750 determines that the offset is out of range.

Thus the first resistance adjustment process steps through the resistances 762rN-762r1, 766rN-766r1 that make up the first and third variable resistances 762, 766 respectively according to an increasing input code sequence, until combinations of the resistances 762rN-762r1, 766rN-766r1 are found that provide a suitable range of resistance values containing the desired resistance ratio for the voltage divider module 760.

The second resistance adjustment process begins at step 1006 with the controller 750 issuing control signals to select the resistance 764r1 representing the most significant bit of the second variable resistance 764. For example, if the second variable resistance 764 comprises four selectable resistances in parallel, the controller 750 may issue a control signal in the form of a binary code with the value 1000 to second variable resistance 764.

At step 1018 the controller 750 compares the differential output Voutdiff of the voltage divider module 760 to the predetermined threshold Vth. If the output Voutdiff exceeds the threshold Vth then the currently selected resistance remains selected (step 1020). On the other hand, if the differential output Voutdiff is less than (or equal to) the threshold then the currently selected resistance is deselected (step 1022).

If the currently selected resistance is the resistance representing the least significant bit of the second variable resistance array 764, as indicated by step 1024, then the process ends, at step 1026.

Otherwise, the controller 750 issues control signals corresponding to the next code in the sequence of input codes to the second variable resistances 764 to select the resistances for use in the next iteration of the second resistance adjustment process. For example, the controller 750 may issue a control signal in the form of a binary code with the value 0100 to select the resistances for use in the second iteration of the second resistance adjustment process, and may issue a control signal in the form of a binary code with the value 0010 or 0110 (depending on the result of the second iteration) to select the resistances for use in the third iteration of the second resistance adjustment process, and so on.

Following the selection of the resistances for the next iteration of the second resistance adjustment process, at step 1030 the differential output signal Voutdiff is again compared to the threshold Vth. If the differential output signal Voutdiff is less than (or equal to) the threshold then the currently selected resistance is deselected (i.e. the process returns to step 1022) and steps 1024 and 1028 are repeated. On the other hand, if the differential output signal Voutdiff is greater than the threshold then the currently selected resistance remains selected (i.e. the process returns to step 1020) and steps 1024 and 1028 are repeated.

Thus, the second resistance adjustment process steps through all the resistances 764$r$1-764$r$N of the second variable resistance 764 according to a decreasing input code sequence, so as to select a combination of resistances 764$r$1-764$r$N that provides a suitable resistance value to provide the desired resistance ratio for the voltage divider module 760.

One of ordinary skill in the art would recognise that the binary search process described above with reference to FIG. 10 is just one example of a suitable mechanism, and that alternative search processes could equally be adopted.

A record may be made, e.g. in a memory of the controller 750, indicating the selected combination of resistances of the first, second and third variable resistances 762, 764, 766, to facilitate and accelerate selection of resistances when the system 700 starts up at some later time.

As discussed above, for simplicity of explanation of the binary search process, it has been assumed that the resistances 762$r$1-762$r$N, 764$r$1-764$r$N, 766$r$1-764$r$N6 are binary weighted. However, in reality the weightings of the resistances 762$r$1-762$r$N, 764$r$1-764$r$N, 766$r$1-764$r$N are selected such that an input-output characteristic of the DAC formed by the variable resistance arrays 762, 764, 766 and output amplifiers 770, 772 is non-monotonic. Thus, the resistances 762$r$1-762$r$N, 764$r$1-764$r$N, 766$r$1-764$r$N are selected so as to produce overlapping ranges of output signal values as shown in FIG. 9. For example, as can be seen in FIG. 9, for input DAC codes in the range I0-I1 output signal values in the range O0-O1 are generated by the DAC. Output signal values in the range O0'-O1, which is a subrange of the range O0-O1 are also generated by the IDAC for input DAC codes in the range I1-I2. These overlapping IDAC output signal value ranges help to ensure adequate performance in finding the desired resistance mismatch ratio for the voltage divider module 760, without requiring excessively small or excessively large resistances, or excessively well matched resistances.

In addition to the overlap between the output ranges of output signal values for the input DAC codes in the "broad" input DAC code ranges I0-I1 and I1-I3, the selection of the resistances 762$r$1-762$r$N, 764$r$1-764$r$N, 766$r$1-764$r$N may also give rise to overlapping output value ranges for narrower subranges of input DAC codes with the broad input DAC code ranges. For example, there may be overlap between output values for input DAC codes in the narrow subrange I0'-I0" and output values for input DAC codes in the narrow subrange I0"-I1'. Both of these subranges are narrow subranges of the broad input DAC code range I0-I1.

Figure 11:
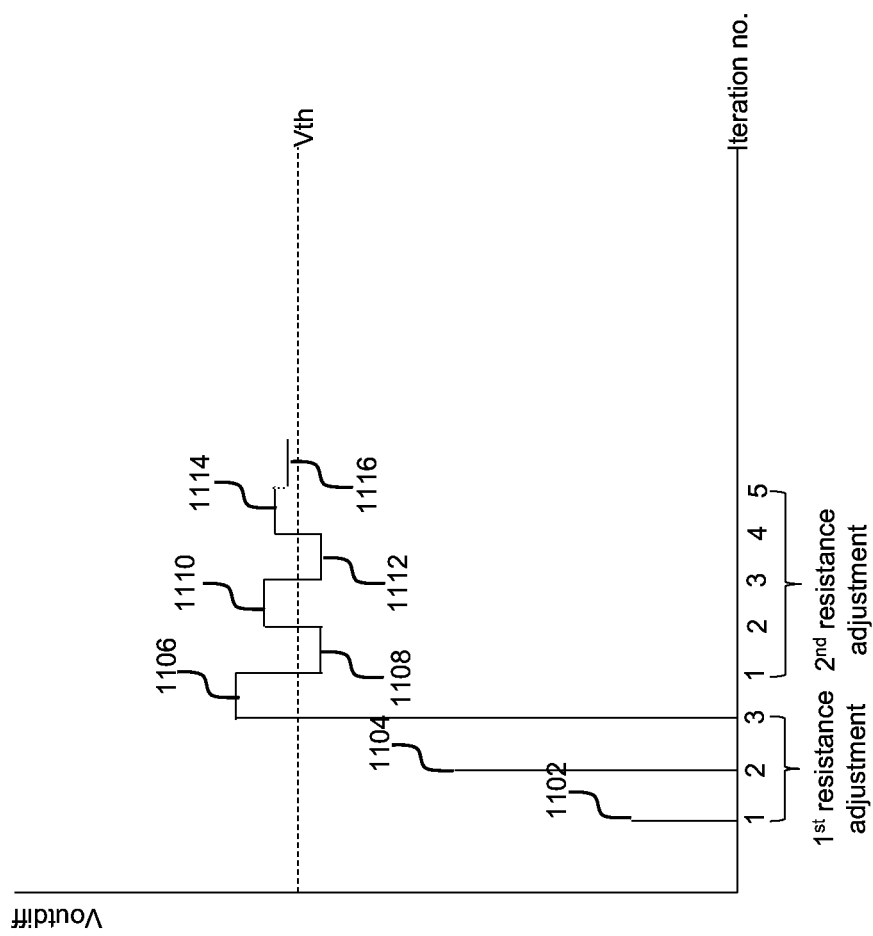
FIG. 11 is a graphical illustration of a binary search process.

FIG. 11 is a graphical illustration of the binary search process described above. In a first iteration 1102 of the first resistance adjustment process, Voutdiff does not reach the thresholds Vth, so the resistances representing the MSBs of the first and third variable resistances 762, 766 are deselected and the resistances corresponding to the next code in the sequence of input codes are selected for a second iteration 1104 of the first resistance adjustment process.

In the second iteration 1104 of the first resistance adjustment process, Voutdiff again undershoots the threshold Vth. Thus, the selected resistances are deselected and the resistances corresponding to the next code in the sequence of input codes are selected for a third iteration 1106 of the first resistance adjustment process.

In the third iteration 1106 of the first resistance adjustment process, Voutdiff overshoots the threshold Vth. Thus, the selected resistances remain selected and the second resistance adjustment process commences, with the resistance 764$r$1 representing the MSB of the second variable resistance 764 being selected.

In a first iteration 1108 of the second resistance adjustment process Voutdiff undershoots the threshold Vth. Thus the resistance 764$r$1 is deselected and the resistance(s) corresponding to the next code in the sequence of input codes are selected for a second iteration 1100 of the second resistance adjustment process.

In the second iteration 1110 of the second resistance adjustment process, Voutdiff overshoots the threshold Vth. Thus the selected resistance(s) remain selected and the resistance(s) corresponding to the next code in the sequence of input codes are selected for a third iteration 1112 of the second resistance adjustment process.

In the third iteration 1112 of the second resistance adjustment process, Voutdiff undershoots the threshold Vth. Thus the resistance(s) that were selected for the third iteration are deselected and the resistances corresponding to the next code in the sequence of input codes are selected for a fourth iteration 1114 of the second resistance adjustment process.

In the fourth iteration 1114 of the second resistance adjustment process, Voutdiff overshoots the threshold Vth. Thus the selected resistance(s) remain selected and the resistance(s) corresponding to the next code in the sequence of input codes are selected for a fifth iteration 1116 of the second resistance adjustment process.

In the fifth iteration 1116 of the second resistance adjustment process, Voutdiff again overshoots the threshold Vth. Thus the selected resistance(s) remain selected. In the example illustrated in FIG. 11 the second resistance adjustment process ends after the fifth iteration, as the combination of the selected resistances of the first, second and third variable resistances 762, 764, 766 provides the matching to within one LSB to the component mismatch ratio of the force sensor.

Figure 12A:
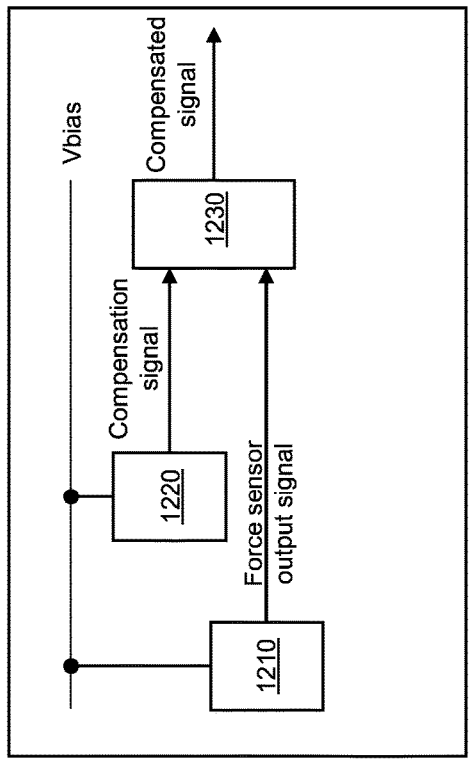
FIGS. 12a-12d illustrate aspects of a force sensor system.

FIGS. 12*a*-12*d* illustrated aspects of a force sensor system according to the present disclosure. FIG. 12*a* shows a force sensor system 1200 comprising a force sensor 1210 configured to receive a bias voltage Vbias and to output a force sensor output signal that includes a wanted sense signal and an offset (e.g. DC offset and/or offset arising from power supply noise or the like). The force sensor 2100 may be, for example, a differential resistive force sensor of the kind illustrated in FIG. 1, a single-ended resistive force sensor, a capacitive force sensor or any other suitable force sensor.

The force sensor system 1200 further comprises compensation circuitry 1220, which is configured to receive the bias voltage Vbias and to output a compensation signal to compensate, at least partially, for the offset in signal the output by the force sensor 1210.

The force sensor system further comprises an amplifier or buffer 1230 which is configured to receive the force sensor output signal output by the force sensor 1210 and the compensation signal output by the compensation circuitry 1220 and to output a compensated output signal in which the offset in the force sensor output signal has been at least partially removed or compensated.

Figure 12B:
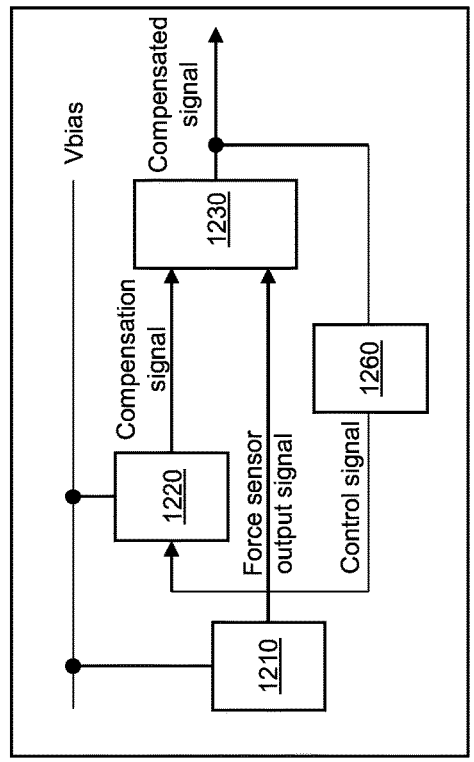

FIG. 12*b* illustrates an alternative force sensor system 1250, which includes a force sensor 1210, compensation circuitry 1220 and an amplifier or buffer 1230 as described above with reference to FIG. 12*a*. The force sensor system 1250 further includes a controller 1260 coupled in a feedback loop between the output of the amplifier or buffer 1230 and the compensation circuitry 1220. The controller 1260 is configured to receive the compensated output signal output by the amplifier or buffer circuitry 1230 and to output a control signal to the compensation circuitry 1220 to control a parameter of the compensation circuitry 1220 based on the compensated signal output by the amplifier or buffer 1230 so as to adjust the compensation signal output by the compensation circuitry 1220.

Figure 12D:
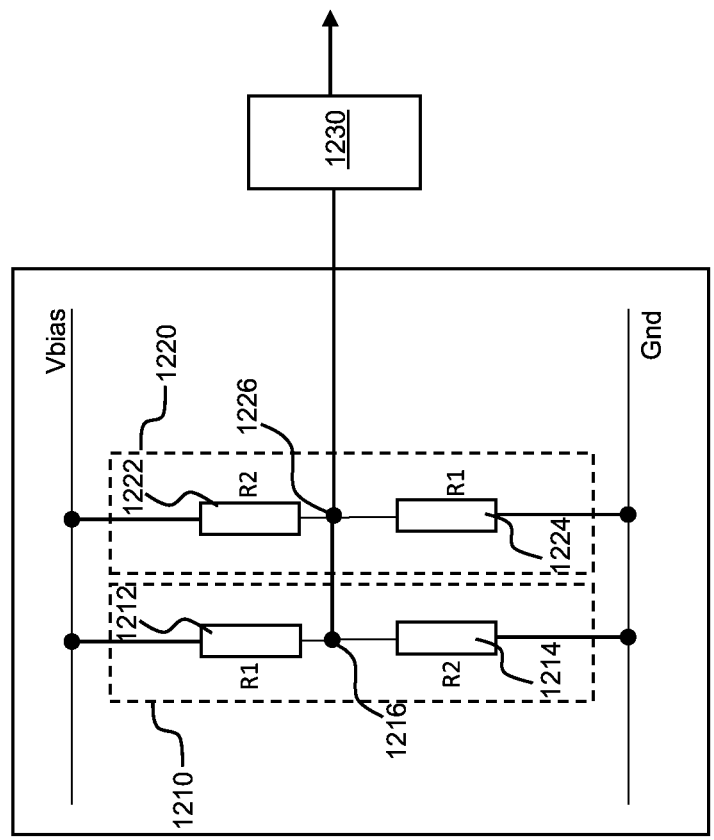
Figure 12C:
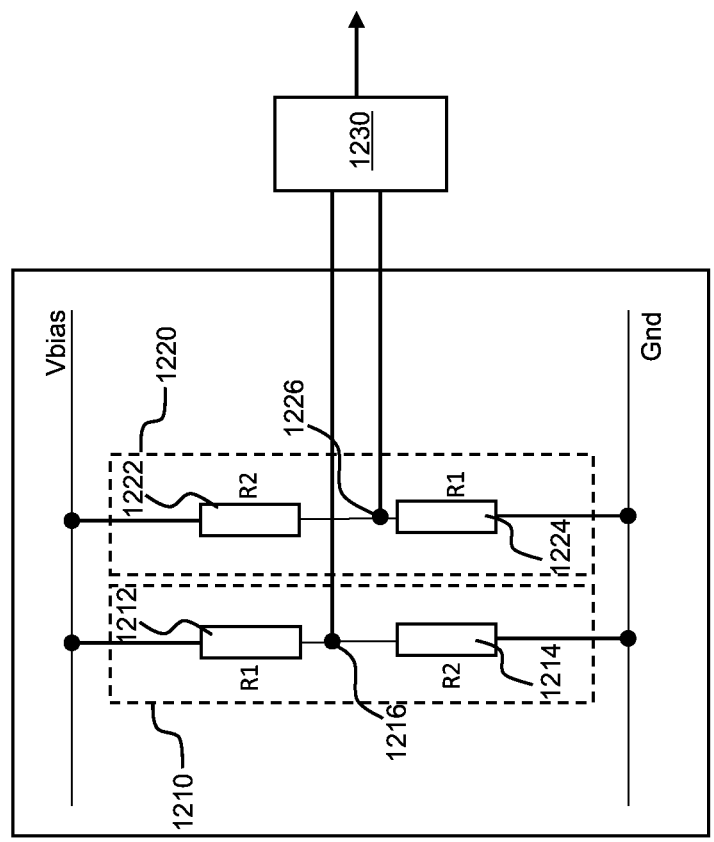

FIG. 12*c* illustrates an arrangement in which the force sensor 1210 and the compensation circuitry 1220 are provided as a single module. In the illustrated arrangement the force sensor 1210 is a single ended resistive force sensor comprising first and second resistances 1212, 1214, of resistance values R1 and R2 respectively, coupled in series between a bias voltage (Vbias) and a reference voltage, which in this example is ground (Gnd). A node 1216 between the first and second resistances 1212, 1214 serves as an output node of the force sensor 1210, and is coupled to a first input of an amplifier or buffer 1230.

The compensation circuitry comprises 1220 first and second resistances 1222, 1224, of resistance values R2 and R1 respectively, coupled in series between a bias voltage (Vbias) and a reference voltage, which in this example is ground (Gnd). A node 1226 between the first and second resistances 1222, 1224 serves as an output node of the compensation circuitry 1220, and is coupled to a second input of an amplifier or buffer 1230. As will be apparent to those skilled in the art, the first and second resistances 1222, 1224 of the compensation circuitry 1220 are arranged in the inverse of the configuration of the resistances 1212, 1214 of the force sensor 1210, such that a compensation signal output by the compensation circuitry via the node 1226 can be used by the amplifier or buffer 1230 to compensate for any offset components that are present in the force sensor output signal output by the force sensor 1210 via the node 1216 so as to generate an amplified or buffered compensated output signal in which the offset in the force sensor output signal has been at least partially removed or compensated.

FIG. 12*d* illustrates an alternative arrangement in which the force sensor 1210 and the compensation circuitry 1220 are provided as a single module. In the illustrated arrangement the force sensor 1210 is a single ended resistive force sensor of the kind described above in relation to FIG. 12*c*, and the compensation circuitry 1220 is similar to the compensation circuitry 1220 described above with respect to FIG. 12*c*.

The arrangement of FIG. 12*d* differs from that of FIG. 12*c* in that the amplifier or buffer 1230 has only a single input, and in that the node 1216 is coupled to the node 1226, which is in turn coupled to the single input of the amplifier or buffer 1230. Thus, in the arrangement of FIG. 12*d* a compensation signal output by the compensation circuitry 1220 is applied to the force sensor output signal output by the force sensor 1210 via the node 1216 and the resulting compensated signal is amplified or buffered by the amplifier or buffer 1230 to generate an amplified or buffered compensated output signal in which the offset in the force sensor output signal has been at least partially removed or compensated.

The compensation circuitry described above with reference to FIGS. 4-12 may be provided as a standalone module or circuitry that can be coupled to force sensor circuitry. Alternatively, the compensation circuitry or module may be provided in a package with force sensor circuitry. For example, the compensation circuitry may be mounted on a common substrate (e.g. a printed circuit board or the like) with a force sensor, thus forming a combined force sensor/compensation circuit or module. As a further alternative, the compensation circuitry or module and/or the force sensor circuitry may be provided in a package with force sense signal acquisition circuitry.

Similarly, the non-monotonic DAC described above may be provided as a standalone module or circuitry, or may be provided in a package with force sensor circuitry or a force sensor module and/or force sense signal acquisition circuitry. For example, the non-monotonic DAC may be mounted on a common substrate (e.g. a printed circuit board or the like) with a force sensor and/or signal acquisition circuitry, thus forming a combined force sensor/non-monotonic DAC/acquisition circuitry module or circuit.

The compensation circuitry (whether provided as a standalone module or packaged in combination with a force sensor) may be provided as part of a device that uses one or more force sensors as user input transducers, for example a portable device such as a mobile telephone, tablet or laptop computer, portable media player, in-vehicle entertainment system, a gaming device or controller or the like. Such devices are typically battery-powered.

As will be appreciated from the foregoing discussion, the present disclosure provides an effective mechanism for compensating for offset (e.g. DC offset and/or offset arising from power supply noise or the like) in the output of a force sensor, thus enabling accurate detection of a desired sense signal in the force sensor output.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A compensation circuit for compensating for an offset voltage that is present in an output signal output by a force sensor, the compensation circuit comprising:
    voltage divider circuitry, the voltage divider circuitry configured to receive a bias voltage that is also supplied to the force sensor and to output a control voltage derived from the bias voltage, wherein a component mismatch ratio of the voltage divider circuitry is adjustable to correspond to a component mismatch ratio of the force sensor;
    current generator circuitry configured to receive the control voltage and to generate a compensating current based on the received control voltage; and
    amplifier circuitry configured to receive a signal output by the force sensor and the compensating current and to output a compensated output signal in which the offset voltage is at least partially cancelled.

2. A compensation circuit according to claim 1, wherein the force sensor is a resistive force sensor, wherein the voltage divider circuitry comprises a plurality of resistances, and wherein the voltage divider circuitry is configured such that a ratio of the plurality of resistances is adjustable so as to correspond to a ratio of resistances of the resistive force sensor.

3. A compensation circuit according to claim 2, wherein the voltage divider circuitry is configured to output a differential output voltage.

4. A compensation circuit according to claim 3, wherein the voltage divider circuitry comprises first, second and third variable resistances that are adjustable such that a ratio of the first, second and third resistances is adjustable so as to correspond to a ratio of resistances of the resistive force sensor.

5. A compensation circuit according to claim 4, wherein the resistances of the voltage divider circuitry are adjustable such that a calibration ratio comprising:
    a difference between a ratio of the combined values of the second and third resistances to the combined values of the first, second and third resistances and a ratio of the value of the third resistance to the combined values of the first, second and third resistances
    is equal to:
    a sensor ratio comprising:
    a difference between a ratio of the value of a first resistance of the force sensor to the value of a second resistance of the force sensor and a ratio of the value of a third resistance of the force sensor to the value of a fourth resistance of the force sensor.

6. A compensation circuit according to claim 4, wherein the first, second and third variable resistances comprise respective first, second and third arrays of selectable resistances.

7. A compensation circuit according to claim 6, wherein the selectable resistances of each array are coupled in parallel with each other, or wherein the selectable resistances of each array are arranged in a ladder configuration.

8. A compensation circuit according to claim 6, wherein resistance values of the selectable resistances of each array are weighted with respect to each other.

9. A compensation circuit according to claim 8, wherein the voltage divider circuitry and the amplifier circuitry constitute a digital to analogue converter (DAC), wherein:
    the resistance values of the selectable resistances of each array are weighted such that an input-output characteristic of the DAC is non-monotonic; or
    the resistance values of the selectable resistances of each array are weighted such that for a given bias voltage, a particular DAC output value can be produced by a plurality of different combinations of selectable resistances of the first, second and third arrays; or the resistance values of the selectable resistances of each array are weighted so as to produce a plurality of overlapping DAC output signal ranges.

10. A compensation circuit according to claim 6, further comprising controller circuitry operative to adjust the resistances of the first, second and third variable resistances by selecting one or more resistances of each of the first, second and third arrays of selectable resistances.

11. A compensation circuit according to claim 10, wherein the controller circuitry is operative to perform a search in order to select the one or more resistances.

12. A compensation circuit according to claim 11, wherein the controller circuitry is operative to select each of the selectable resistances of the first, second and third arrays according to a predefined sequence and to compare an output of the voltage divider circuitry to a threshold order to select the one or more resistances.

13. A compensation circuit according to claim 10, wherein the controller circuitry is operative to compare the differential output of the force sensor to the compensated differential output signal and to adjust the resistances of the first, second and third variable resistances if the result of the comparison indicates the presence of offset in the compensated differential output signal.

14. A compensation circuit according to claim 1, wherein the amplifier circuitry comprises a feedback loop, wherein the compensating current is injected into the feedback loop so as to generate a compensating voltage in the amplifier circuitry to at least partially cancel the offset voltage in the compensated differential output signal, wherein, optionally, the feedback loop includes first and second resistances, wherein the compensating current is injected at a node between the first and second resistances.

15. A compensation circuit according to claim 1, further comprising a gain element coupled to an output of the voltage divider circuitry so as to apply gain to the control voltage output by the voltage divider circuitry.

16. A compensation circuit according to claim 15, further comprising a resistance coupled to an output of the gain element, wherein a resistance value of the resistance is equal to a resistance value of a parallel combination of the first and second resistances, or wherein a resistance value of the resistance is equal to a multiple of a resistance value of a parallel combination of the first and second resistances.

17. A compensation circuit for compensating for an offset voltage that is present in a differential output signal output by a force sensor, the compensation circuit comprising:
voltage divider circuitry, the voltage divider circuitry configured to receive a bias voltage that is also supplied to the force sensor and to output a control voltage derived from the bias voltage, wherein a ratio of the control voltage to the bias voltage is adjustable to correspond to a ratio of a quiescent differential output voltage of the force sensor to the bias voltage;
current generator circuitry configured to receive the control voltage and to generate a compensating current based on the received control voltage; and
amplifier circuitry configured to receive the differential signal output by the force sensor and the compensating current and to output a compensated differential output signal in which the offset voltage is at least partially attenuated.

18. A force sensor circuit comprising:
a resistive force sensor;
a bias voltage generator circuitry coupled to the resistive force sensor to supply a bias voltage to the resistive force sensor; and
compensation circuitry for compensating for an offset voltage that is present in a differential output signal output by the force sensor, the compensation circuitry comprising:
voltage divider circuitry, the voltage divider circuitry configured to receive the bias voltage and to output a control voltage derived from the bias voltage, wherein a component mismatch ratio of the voltage divider circuitry is adjustable to correspond to a component mismatch ratio of the force sensor;
current generator circuitry configured to receive the control voltage and to generate a compensating current based on the received control voltage; and
amplifier circuitry configured to receive the signal output by the force sensor and the compensating current and to output a compensated output signal in which the offset voltage is at least partially cancelled.

19. An integrated circuit comprising a force sensor circuit according to claim 18.

20. A device comprising a force sensor circuit according to claim 18, wherein the device comprises a mobile telephone, a tablet computer, a laptop computer, a portable media player, a gaming device, a gaming controller, an in-vehicle entertainment system, or a battery powered device.

* * * * *